United States Patent
Furukubo et al.

(10) Patent No.: US 10,862,264 B2
(45) Date of Patent: Dec. 8, 2020

(54) LIGHT-EMITTING ELEMENT HOUSING MEMBER, ARRAY MEMBER, AND LIGHT-EMITTING DEVICE

(71) Applicant: KYOCERA Corporation, Kyoto (JP)

(72) Inventors: Youji Furukubo, Kyoto (JP); Sentaro Yamamoto, Kyoto (JP); Masanori Okamoto, Kyoto (JP); Katsuaki Masaki, Kyoto (JP); Takehiro Nishimura, Kyoto (JP); Kazuya Shibata, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/094,343

(22) PCT Filed: Apr. 18, 2017

(86) PCT No.: PCT/JP2017/015601
§ 371 (c)(1),
(2) Date: Oct. 17, 2018

(87) PCT Pub. No.: WO2017/183638
PCT Pub. Date: Oct. 26, 2017

(65) Prior Publication Data
US 2019/0131765 A1 May 2, 2019

(30) Foreign Application Priority Data

Apr. 18, 2016 (JP) .................................. 2016-082994
Jul. 26, 2016 (JP) .................................. 2016-146592
Aug. 29, 2016 (JP) .................................. 2016-166726

(51) Int. Cl.
*H01S 5/022* (2006.01)
*H01S 5/02* (2006.01)

(52) U.S. Cl.
CPC .......... *H01S 5/02268* (2013.01); *H01S 5/022* (2013.01); *H01S 5/0207* (2013.01)

(58) Field of Classification Search
CPC ...... H01S 5/02268; H01S 5/0207; H01S 5/02; H01S 5/022; H01F 17/03; H01B 17/305;
(Continued)

(56) References Cited

U.S. PATENT DOCUMENTS 6,256,437 B1  7/2001  Sakushima et al.
6,970,486 B2 * 11/2005 Nakata ................ H01S 5/02248
                                                    372/36

(Continued)

FOREIGN PATENT DOCUMENTS

CN    100587560 C    2/2010
JP    60-063981 A    4/1985
(Continued)

*Primary Examiner* — Tuan N Nguyen
(74) *Attorney, Agent, or Firm* — Volpe Koenig

(57) ABSTRACT

A light-emitting element housing member includes a substrate that is made of a ceramic and internally includes a deep-bottom-type space portion having an opening in at least one position thereof, wherein an inner wall of the space portion serves as a mounting part for a light-emitting element. A light-emitting element housing member includes a mounting part meant for mounting a light-emitting element and includes a substrate that includes a bottom base material having a rectangular shape in a planar view and a wall member provided on the bottom base material to enclose the mounting part in a U-shaped manner and have an opening in at least one portion thereof, wherein the substrate is integrally formed of a ceramic.

13 Claims, 34 Drawing Sheets

(58) Field of Classification Search
CPC .............. H01G 7/026; H01L 23/49506; H01L 23/3731
USPC .......................................................... 385/90
See application file for complete search history.

(56) References Cited

U.S. PATENT DOCUMENTS

| | | | |
|---|---|---|---|
| 8,976,825 B1* | 3/2015 | Redpath | H01S 5/02 |
| | | | 372/36 |
| 2002/0093738 A1* | 7/2002 | Kimura | G02B 6/4218 |
| | | | 359/489.05 |
| 2004/0179562 A1* | 9/2004 | Carroll | H01S 5/042 |
| | | | 372/36 |
| 2004/0208210 A1* | 10/2004 | Inoguchi | H01L 24/48 |
| | | | 372/36 |
| 2006/0083281 A1* | 4/2006 | Inoguchi | H01L 25/0753 |
| | | | 372/50.12 |
| 2008/0225913 A1 | 9/2008 | Stohr et al. | |
| 2009/0080485 A1 | 3/2009 | Yamasaki et al. | |
| 2010/0246628 A1 | 9/2010 | Hattori et al. | |
| 2011/0110095 A1* | 5/2011 | Li | F21V 29/83 |
| | | | 362/294 |
| 2014/0131454 A1* | 5/2014 | Weisshaupt | A61B 90/90 |
| | | | 235/492 |
| 2014/0228914 A1* | 8/2014 | van de Ven | A61N 5/0618 |
| | | | 607/88 |
| 2014/0240952 A1* | 8/2014 | Nakanishi | H01S 5/4012 |
| | | | 362/19 |
| 2015/0023376 A1 | 1/2015 | Yamanaka et al. | |
| 2015/0255949 A1* | 9/2015 | Lee | H01S 5/02216 |
| | | | 372/36 |
| 2016/0268770 A1* | 9/2016 | Tazawa | H01S 5/0092 |
| 2016/0320004 A1* | 11/2016 | Tudorica | F21K 9/62 |
| 2017/0122505 A1* | 5/2017 | Kiyota | H01S 5/02276 |
| 2017/0317469 A1* | 11/2017 | Kiyota | H01S 5/005 |

FOREIGN PATENT DOCUMENTS

| | | |
|---|---|---|
| JP | 61-013677 A | 1/1986 |
| JP | 04-335581 A | 11/1992 |
| JP | 11-109184 A | 4/1999 |
| JP | 2004-259860 A | 9/2004 |
| JP | 2004-309506 A | 11/2004 |
| JP | 2006-308738 A | 11/2006 |
| JP | 2007-305977 A | 11/2007 |
| JP | 2008-028273 A | 2/2008 |
| JP | 2009-076730 A | 4/2009 |
| JP | 2010-225917 A | 10/2010 |
| JP | 2014-116514 A | 6/2014 |
| WO | 2007/048362 A1 | 5/2007 |
| WO | 2013/128794 A1 | 9/2013 |

* cited by examiner

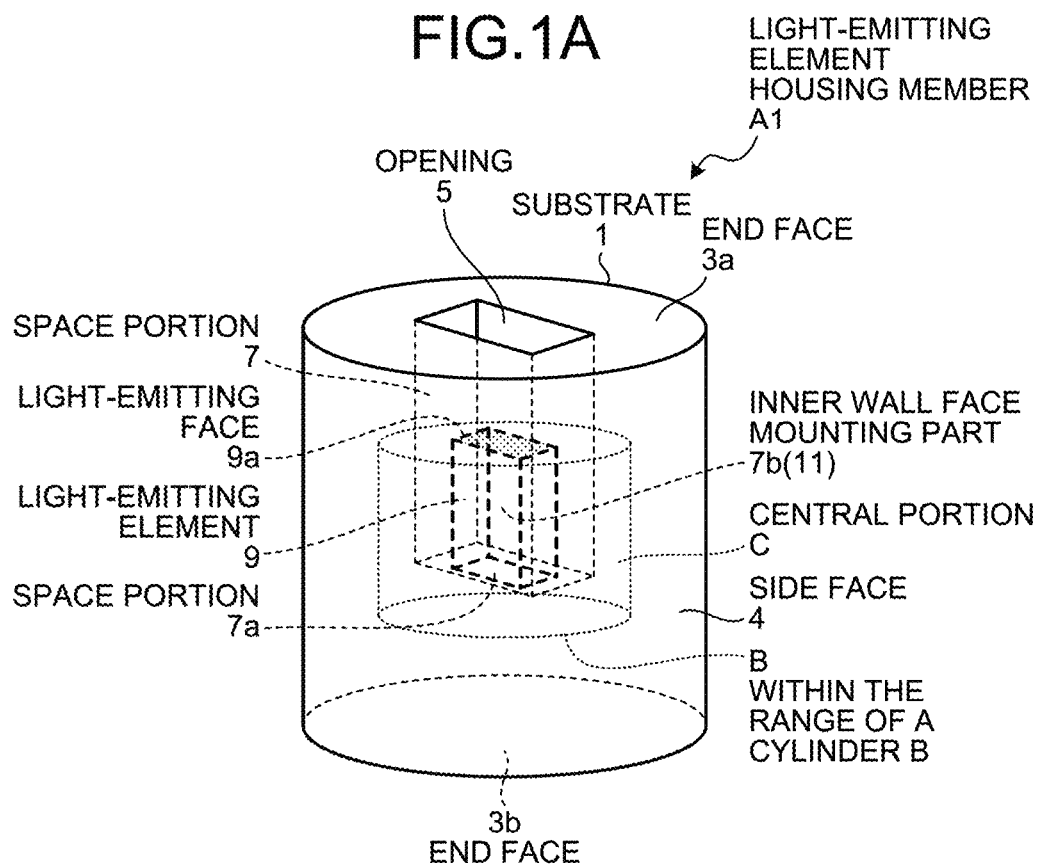
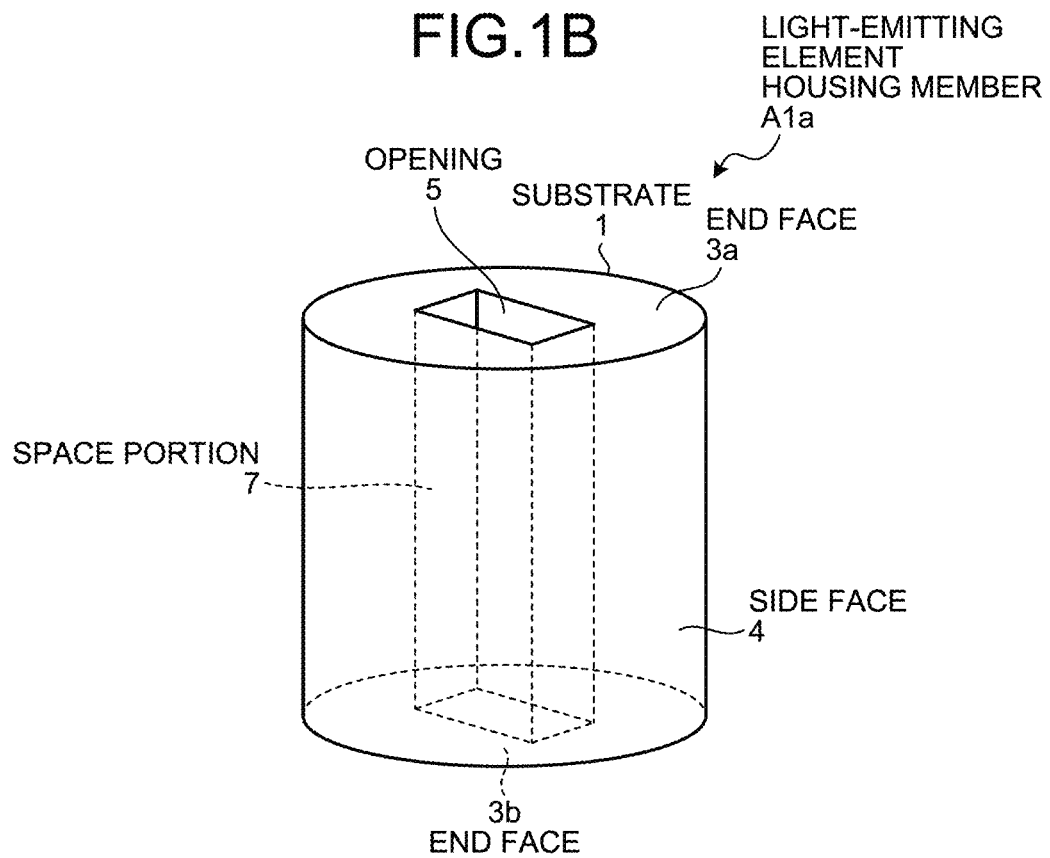

FIG.14
(a) 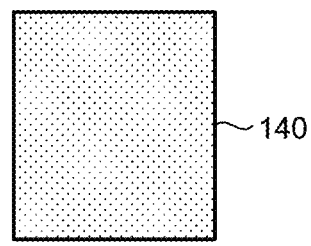
(b) 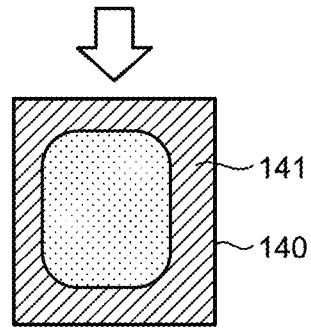
(c) 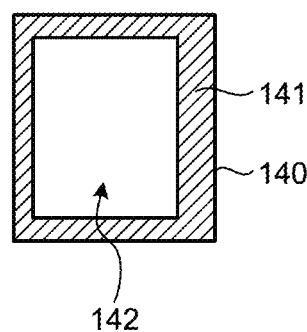

LIGHT-EMITTING ELEMENT HOUSING MEMBER, ARRAY MEMBER, AND LIGHT-EMITTING DEVICE

CROSS-REFERENCE TO RELATED APPLICATIONS

This application is a national stage application of International Application No. PCT/JP2017/015601 filed on Apr. 18, 2017, which designates the United States, which is herein incorporated by reference, and which is based upon and claims the benefit of priority to Japanese Patent Application No. 2016-082994 filed on Apr. 18, 2016, Japanese Patent Application No. 2016-146592 filed on Jul. 26, 2016, and Japanese Patent Application No. 2016-166726 filed on Aug. 29, 2016, the entire contents of which are herein incorporated by reference.

FIELD

The present disclosure relates to a light-emitting element housing member, an array member, and a light-emitting device.

BACKGROUND

In recent years, a semiconductor laser is being increasingly used as a light source that is used in a projector or a head-mounted display that are used for projecting images (for example, see Patent Literature 1).

CITATION LIST

Patent Literature

Patent Literature 1: Japanese Patent Application Publication No. 2008-028273

SUMMARY

A light-emitting element housing member according to the present disclosure includes a substrate that is made of a ceramic and internally includes a deep-bottom-type space portion having an opening in at least one position thereof, wherein an inner wall of the space portion serves as a mounting part for a light-emitting element.

A light-emitting element housing member in the present disclosure includes a mounting part for mounting a light-emitting element and includes a substrate that includes a bottom base material having a rectangular shape in a planar view and a wall member provided on the bottom base material to enclose the mounting part in a U-shaped manner and have an opening in at least one portion thereof, wherein the substrate is integrally formed of a ceramic.

An array member according to the present disclosure is provided wherein a plurality of light-emitting element housing members as described above are joined.

A light-emitting device according to the present disclosure includes a light-emitting element on a mounting part of a light-emitting element housing member as described above.

BRIEF DESCRIPTION OF DRAWINGS

FIG. 1A is a schematic diagram illustrating a light-emitting element housing member according to a first embodiment.

FIG. 1B is a schematic diagram illustrating, as a variation of the light-emitting element housing member according to the first embodiment, a structure with a space portion penetrates through an area between end faces thereof.

FIG. 3A is viewed from the side of the opening (from the direction of an arrow illustrated in FIG. 3A).

FIG. 4A is viewed from the side of the opening (from the direction of an arrow illustrated in FIG. 4A).

FIG. 14 is a plan view illustrating a manufacturing process of the light-emitting element housing member according to the sixth embodiment.

DESCRIPTION OF EMBODIMENTS

Figure 24A:
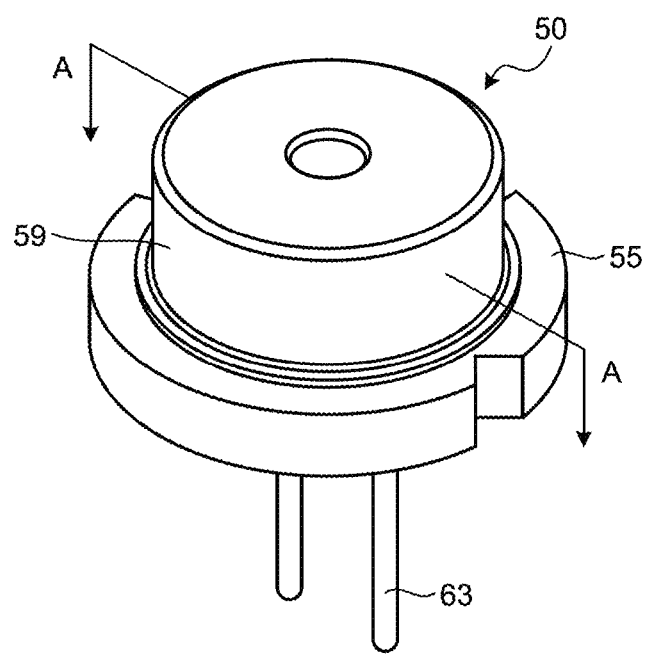
FIG. 24A is a schematic diagram illustrating an example of a conventional semiconductor laser device.
Figure 24B:
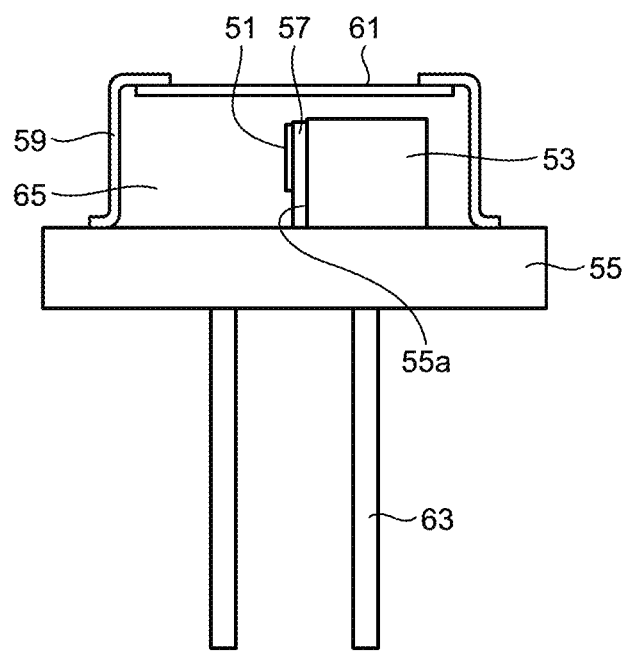
FIG. 24B is a cross-sectional view along line A-A in FIG. 24A.

FIG. 24A is a schematic diagram illustrating an example of a conventional semiconductor laser device. FIG. 24B is a cross-sectional view along line A-A in FIG. 24A. A semiconductor laser device 50 illustrated in FIGS. 24A and 24B is usually referred to as CAN package type (TO-CAN). In FIGS. 24A and 24B, the semiconductor laser device is referred to by the reference numeral 50, a semiconductor laser is referred to by a reference numeral 51, a stem base is referred to by a reference numeral 53, a stem block is referred to by a reference numeral 55, a side face of the stem block is referred to by a reference numeral 55a, an insulation member is referred to by a reference numeral 57, a cap is referred to by a reference numeral 59, a glass plate (window)

is referred to by a reference numeral 61, and a lead pin is referred to by a reference numeral 63.

In the semiconductor laser device 50, since the driving of the semiconductor laser 51 results in a rise in temperature, it becomes necessary to have a structure enabling enhancement in the heat dissipation of the entire device. For that reason, in the CAN package type, as illustrated in FIGS. 24A and 24B, a structure is adapted where the metallic stem block 55 is disposed on the metallic stem base 53 and the insulation member 57 made of a ceramic member having high thermal conductivity is applied onto the stem block 55.

In the semiconductor laser device 50 illustrated in FIGS. 24A and 24B, the semiconductor laser 51 is disposed on the side face 55a present on one side of the stem block 55. Hence, if it is attempted to position the semiconductor laser 51 in the center of the stem base 53, then it becomes necessary to provide a space 65 in the side face 55a of the stem block 55 where the semiconductor laser 51 is bonded thereto. However, that results in a structure having an unnecessarily large size.

In that regard, in the present disclosure, it is an object to provide a light-emitting element housing member, an array member, and a light-emitting device that enable achieving a high degree of heat dissipation and achieving downsizing.

First Embodiment and Second Embodiment

The light-emitting element housing members described below are assumed to cover the type where a light-emitting element is disposed in the space provided on the inside, unlike a flat plate-like light-emitting element housing member where a light-emitting element, such as a semiconductor laser (also called a laser diode), is bonded on one face. Thus, the structures described below are only representative examples, and the present disclosure is not limited by those structures. In FIG. 1A is illustrated a light-emitting element housing member A1 having a cylindrical outer shape according to a first embodiment. However, the cylindrical outer shape represents only the fundamental shape; and, depending on the specifications of the semiconductor laser device, the shape of the outer face can be formed by modifying the outer shape within the acceptable range of deterioration in the characteristics. For example, as in the case of a light-emitting element housing member A2 according to a second embodiment, the outer shape can be cuboid or can be polyhedral due to a combination of a plurality of planes having an arbitrary area. In FIG. 1A, the state where a light-emitting element 9 is mounted is illustrated in order to enable easier understanding of the state where the light-emitting element 9 is mounted. In the light-emitting element 9 illustrated in FIG. 1A, the light-emitting face is referred to by a reference numeral 9a.

In the light-emitting element housing member A1 illustrated in FIG. 1A according to the first embodiment, a substrate 1 is made of a ceramic. That is, the substrate 1 is made of a sintered compact of ceramic particles. Moreover, the substrate 1 includes a substrate 1 that internally includes a deep-bottom-type space portion 7 where an opening 5 is formed in at least one region thereof and the inner wall of the space portion 7 serves as the mounting part for the light-emitting element 9.

More specifically, the outer shape of the substrate 1 is formed by two end faces 3a and 3b facing each other and a side face 4 that is perpendicular to the end faces 3a and 3b. Moreover, in the substrate 1, the opening 5 is formed on the end face 3a and is continuous with the space portion 7 provided inside the substrate 1. In this case, the space portion 7 has a deep-bottom-type shape. When a longest diameter L1 of the opening 5 is compared with a distance L2 to the deepest part of the space portion 7, the deep-bottom-type shape implies that the relationship of L2>L1 holds true. The relationship of L2>L1 is adapted in an identical manner also in the light-emitting element housing member A2 illustrated in FIG. 2.

In other words, the substrate 1 includes the space portion 7 where, of the two end faces 3a and 3b, the end face 3a is treated as the opening 5. The space portion 7 extends in the direction from the end face 3a, where the opening 5 is formed thereon, toward the other end face 3b. In this case, the space portion 7 has a base portion 7a that is closed inside the substrate 1. Alternatively, as illustrated in the structure of a light-emitting element housing member A1a in FIG. 1B, the space portion 7 can penetrate through the area in between the end faces 3a and 3b. In the case where the space portion 7 penetrates through the area in between the end faces 3a and 3b, the light emitted by the light-emitting element 9 can be channelized toward the end face 3a as well as the end face 3b. Herein, some part of an inner wall face 7b that is parallel to the side face 4 of the space portion 7 represents an installation face 11 for the light-emitting element 9 (hereinafter, the installation face is sometimes referred to as a mounting part 11). The structure where the space portion 7 penetrates through the area in between the end faces 3a and 3b is adapted in an identical manner also in the light-emitting element housing member A2 illustrated in FIG. 2.

Meanwhile, although not illustrated in FIG. 1A, on the installation face 11 (the mounting part 11) for the light-emitting element 9 in the space portion 7, a conductor is formed for supplying electrical power to the light-emitting element 9. For example, the conductor passes from the mounting part 11 through the inside of the substrate 1, and is guided to the side face 4 or the end face 3b of the substrate 1.

As far as the substrate 1 is concerned, it is possible to use various types of ceramics. However, it is desirable to use aluminum nitride because it has high thermal conductivity and has the coefficient of thermal expansion to be close to the light-emitting element 9 (for example, a semiconductor laser). When aluminum nitride is used in the substrate 1, one of tungsten (W), molybdenum (Mo), an alloy of tungsten or molybdenum, or a metallic material formed by combining copper with tungsten or molybdenum is suitable for the conductor because of the fact that co-firing becomes possible.

In the light-emitting element housing member A1 according to the first embodiment, when the light-emitting element 9 is disposed in the center of the substrate 1 constituting the light-emitting element housing member A1; it is no more required to provide an inessential space unlike in the conventional semiconductor laser device 50 illustrated in FIGS. 24A and 24B where the space 65 is provided on the side face 55a of the stem block 55 where the semiconductor laser 51 is bonded thereto. As a result, it becomes possible to achieve downsizing of the semiconductor laser device.

Moreover, in the light-emitting element housing member A1 according to the first embodiment, since the light-emitting element 9 is adjacent to and enclosed by the substrate 1 except for the light-emitting face 9a, it becomes possible to enhance the heat dissipation from the other faces other than the light-emitting face 9a of the light-emitting element 9. Hence, when viewed from the direction perpendicular to the end face 3a (or the end face 3b), it is preferable that the space portion 7 is provided at a central portion C of the end face 3a (3b) (in FIG. 1A, within the range of a cylinder B illustrated by dashed lines). When the space portion 7 is provided at the central portion C of the end face 3a, the distance from the space portion 7 to the side face 4 of the substrate 1 becomes equal in all directions. As a result, there is improvement in the balance of heat dissipation, and there is a decrease in the location-dependent temperature difference in the light-emitting element 9. As a result, light emission can be performed in a stable manner. Besides, a long product life of the substrate 1 can also be achieved.

In this case, in the substrate 1, the side face 4 can have asperity formed thereon from the perspective of enhancing the heat dissipation.

Meanwhile, it is preferable that the space portion 7 provided in the substrate 1 has such a size that at least some part of the light-emitting element 9 excluding the light-emitting face 9a makes contact with the inner wall face 7b or can have a slightly larger size so that the light-emitting element 9 excluding the light-emitting face 9a is close to the inner wall face 7b. In the case of having the light-emitting element 9 to be close to the inner wall face 7b of the substrate 1, it can be fixed using a filling material doubling as a jointing material. In that case, it is preferable that the thickness of the jointing material is set to be equal to or smaller than 50 μm for the reason of not significantly deteriorating the thermal conductivity.

Figure 2:
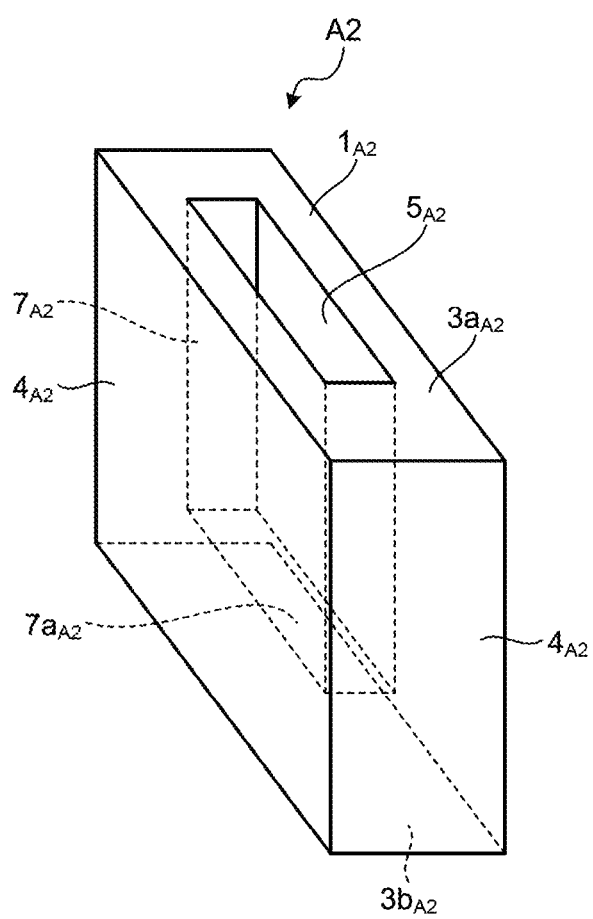
FIG. 2 is a schematic diagram illustrating a light-emitting element housing member according to a second embodiment.

Meanwhile, also in the light-emitting element housing member A2 illustrated in FIG. 2, a substrate $1_{A2}$ is made of a ceramic using a sintered compact of ceramic particles. Moreover, the substrate $1_{A2}$ approximately has the shape of a hexahedron. In this case too, the outer shape of the substrate $1_{A2}$ is formed by two end faces $3a_{A2}$ and $3b_{A2}$ facing each other and a side face $4_{A2}$ that is perpendicular to the end faces $3a_{A2}$ and $3b_{A2}$. Furthermore, in the substrate $1_{A2}$ too, an opening $5_{A2}$ is formed on the end face $3a_{A2}$ and is continuous with a space portion $7_{A2}$ provided inside the substrate $1_{A2}$. In the substrate $1_{A2}$ too, the space portion $7_{A2}$ extends in the direction from the end face $3a_{A2}$, where the opening $5_{A2}$ is formed thereon, toward the other end face $3b_{A2}$. The space portion $7_{A2}$ has a base portion $7a_{A2}$ that is closed inside the substrate $1_{A2}$. However, alternatively, the space portion $7_{A2}$ can penetrate through the area in between the end faces $3a_{A2}$ and $3b_{A2}$. In the light-emitting element housing member A2 too, it becomes possible to achieve identical effects to the effects achieved in the light-emitting element housing member A1 described earlier.

Figure 1C:
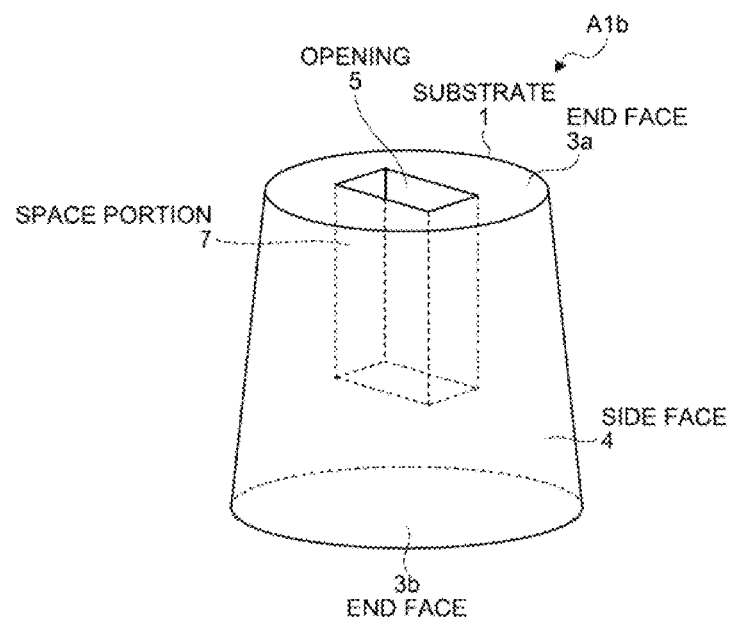
FIG. 1C is a schematic diagram illustrating, as a variation of the light-emitting element housing member according to the first embodiment, a case where a substrate has a truncated-conical shape.

Regarding the light-emitting element housing member A1a mentioned earlier, the substrate 1 can have a truncated-conical shape as in the case of a light-emitting element housing member A1b illustrated in FIG. 1C. When the substrate 1 has a truncated-conical shape; it enables achieving enhanced stability when the light-emitting element housing member A1b is kept stationary, as well as it enables achieving reduction in the axial runout of the optical axis when the light-emitting element housing member A1b is driven.

Figure 1D:
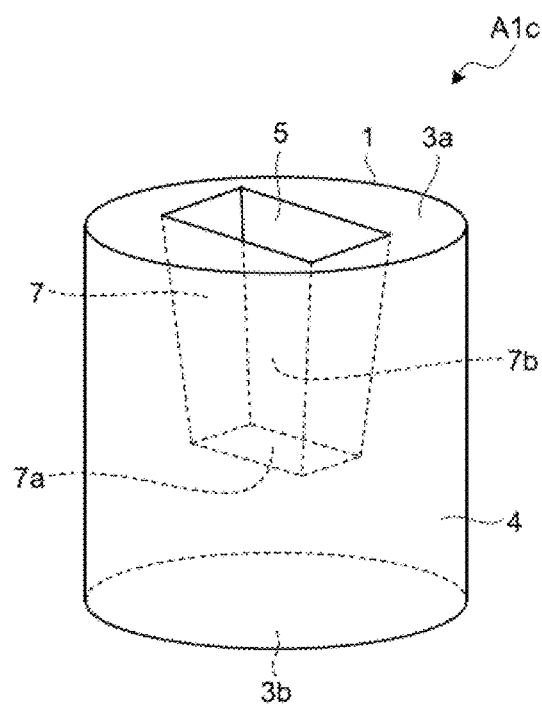
FIG. 1D is a schematic diagram illustrating, as a variation of the light-emitting element housing member according to the first embodiment, a case where an inner wall of a substrate constitutes an inclined surface and an area of a frontage on the side of an opening is greater than an area of a base portion positioned at a back thereof.

As illustrated in FIG. 1D, in a light-emitting element housing member A1c, in the substrate 1, the inner wall face 7b can constitute an inclined surface, and an area of the frontage on the side of the opening 5 can be greater than an area of the base portion 7a positioned at a back thereof. When at least a part of the inner wall face 7b of the space portion 7 constitutes an inclined surface and when an area of the frontage on the side of the opening 5 is greater than the an area of the base portion 7a positioned at a back thereof, the light emitted from the light-emitting element 9 can be channelized over a wide range, and thus it becomes possible to obtain a light-emitting device capable of covering a wide range with only a small number of light-emitting elements 9. Meanwhile, the structure where an area of the frontage on the side of the opening 5 is greater than an area of the base portion 7a positioned at a back thereof can be adapted in an identical manner in the light-emitting element housing member A2.

Figure 1E:
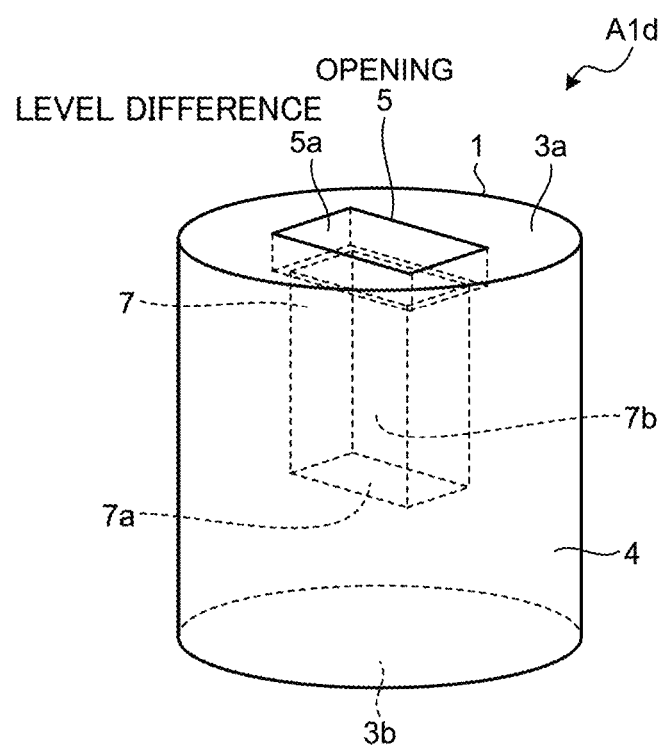
FIG. 1E is a schematic diagram illustrating, as a variation of the light-emitting element housing member according to the first embodiment, a case where a frontage is greater in size than a back side due to a level difference near an opening.

As illustrated in FIG. 1E, in a light-emitting element housing member A1d, in the substrate 1, due to a level difference 5a formed near the opening 5, the frontage can be greater in size than the back side. When the level difference 5a is formed near the opening 5 of the substrate 1 so that the frontage on the side of the end face 3a is greater in size than the back side, a lens can be fit in the portion where the frontage is greater in size. Hence, as compared to the case where the lens is placed on the end face 3a, there is a decrease in the defects such as the lens getting scratched. As a result, the reliability of the light-emitting device can be enhanced. Meanwhile, the structure where the level difference 5a is formed near the opening 5 of the substrate 1 so that the frontage on the side of the end face 3a is greater in size than the back side can also be adapted in an identical manner in the light-emitting element housing member A2.

Third Embodiment

Figure 3A:
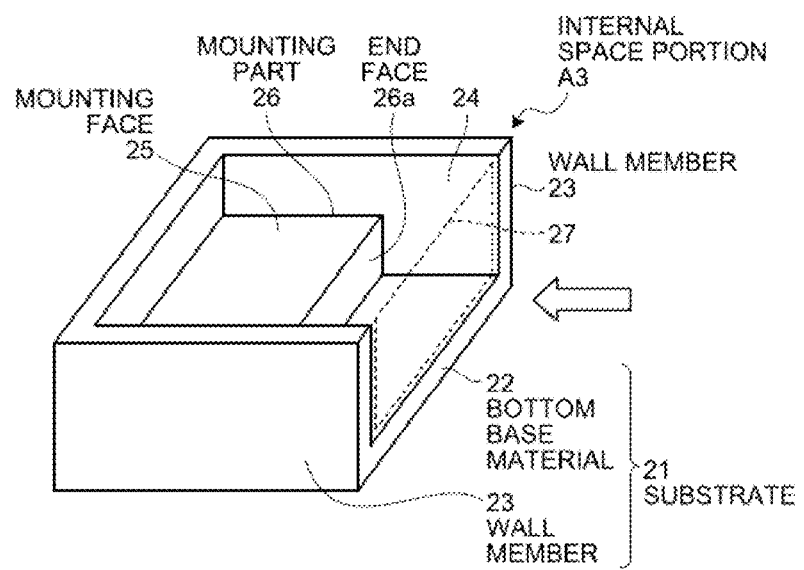
FIG. 3A is a perspective view illustrating a light-emitting element housing member according to a third embodiment.
Figure 3B:
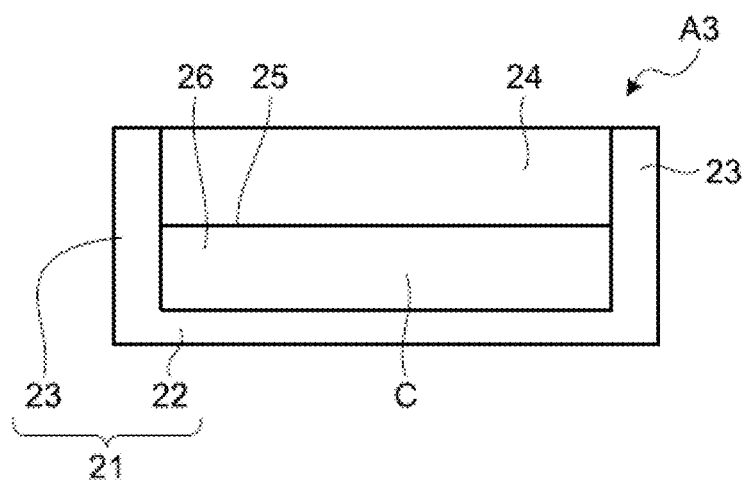
FIG. 3B is a plan view when
Figure 4A:
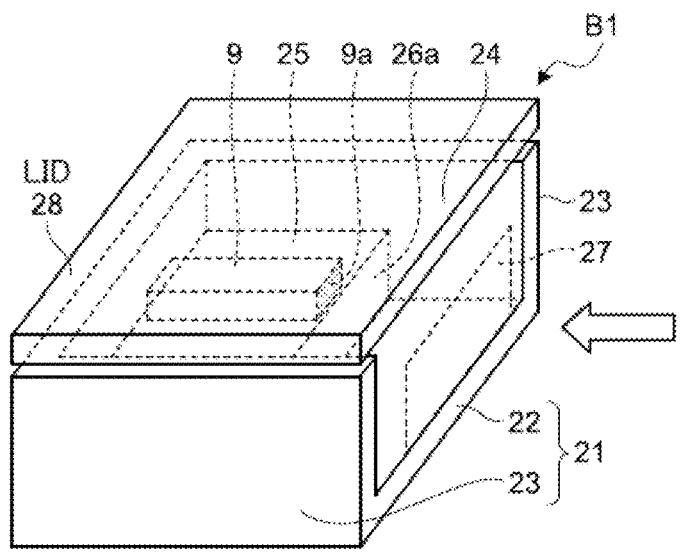
FIG. 4A is a schematic diagram illustrating a light-emitting device according to the first embodiment.
Figure 4B:
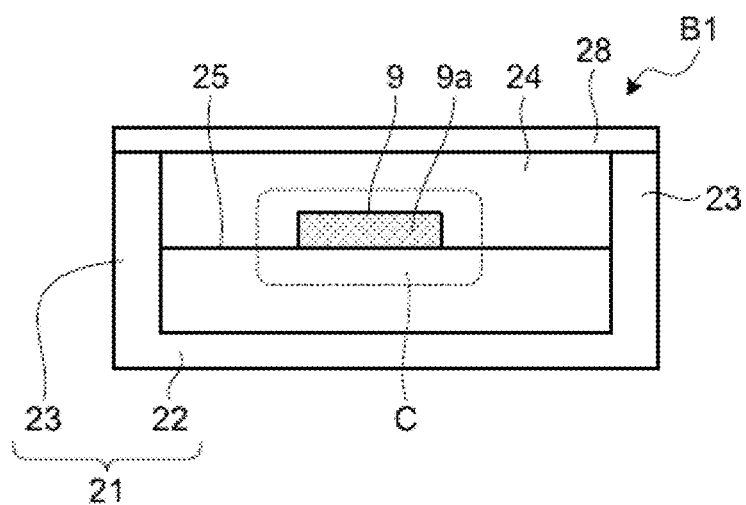
FIG. 4B is a plan view when

FIG. 3A is a perspective view of a light-emitting element housing member A3 according to a third embodiment, and FIG. 3B is a plan view when FIG. 3A is viewed from the side of the opening (from the direction of an arrow illustrated in FIG. 3A). FIG. 4A is a schematic diagram illustrating a light-emitting device B1 according to the first embodiment, and FIG. 4B is a plan view when FIG. 4A is viewed from the side of the opening (from the direction of an arrow illustrated in FIG. 4A). The light-emitting device B1 according to the first embodiment as illustrated in FIGS. 4A and 4B is a perspective view illustrating the state where a lid 28 is placed on the light-emitting element housing member A3 according to the third embodiment as illustrated in FIGS. 3A and 3B and the light-emitting element 9 is installed inside. With reference to FIGS. 4A and 4B, the light-emitting face is referred to by the reference numeral 9a.

The light-emitting element housing member A3 illustrated in FIGS. 3A and 3B includes a substrate 21 that is configured with a bottom base material 22 having a rectangular shape in planar view and wall members 23 placed on the bottom base material 22. The wall members 23 enclose a mounting face 25 in a U-shaped manner, and an opening 27 (in FIG. 3A, the portion enclosed by dashed lines) is formed in one region. The portion where the mounting face 25 is raised from the bottom base material 22 in the thickness direction is called a mounting part 26. The bottom base material 22, the wall members 23, and the mounting part 26 are integrally formed using a ceramic.

In the light-emitting element housing member A3 according to the third embodiment, as a result of placing the lid 28 on the top face of the substrate 21, the outward appearance is such that the light-emitting element 9 is disposed inside an internal space portion 24 enclosed by the bottom base material 22 and the wall members 23 as can be understood from FIGS. 4A and 4B. Also regarding the light-emitting element housing member A3 according to the third embodiment, it is no more required to provide an inessential space unlike in the conventional semiconductor laser device 50 illustrated in FIGS. 24A and 24B where the space 65 is provided on the side face 55a of the stem block 55 where the semiconductor laser 51 is bonded thereto. As a result, it becomes possible to achieve downsizing of the light-emitting device B1.

Moreover, in the light-emitting element housing member A3, since the bottom base material 22, the wall members 23, and the mounting part 26 are integrally formed using a ceramic; it is no more required to use an insulation member unlike in the conventional semiconductor laser device 50 illustrated in FIGS. 24A and 24B where the insulation member 57 is used at the time of installing the semiconductor laser 51 (the light-emitting element 9) in the metallic stem base 53 so as to achieve insulation in between the light-emitting element 9 and the stem base 53. In the conventional semiconductor laser device 50 illustrated in FIGS. 24A and 24B, a jointing material needs to be used at two regions, namely, in between the stem base 53 and the insulation member 57 and in between the semiconductor laser 51 and the insulation member 57. In contrast, in the light-emitting element housing member A3, the portion used as an alternative to the stem base 53 is made of a ceramic that inherently has strong insulation properties. Hence, the insulation member 57 need not be used. That is, in the light-emitting element housing member A3, it is sufficient to use a jointing material in between the light-emitting element 9 and the ceramic mounting part 26. Since it becomes possible to reduce the number of regions of using the jointing material that causes deterioration in heat dissipation, the light-emitting device B1 having a higher degree of head dissipation can be obtained.

In the light-emitting element housing member A3 according to the third embodiment as illustrated in FIGS. 3A and 3B; the opening 27 is formed in the direction of extension of the light-emitting element 9 along the longitudinal direction. Excluding the light-emitting face 9a thereof, the light-emitting element 9 is enclosed in between the bottom base material 22, the wall members 23, and the lid 28. Hence, it becomes possible to enhance the head dissipation from the other faces excluding the light-emitting face 9a of the light-emitting element 9.

For that reason, it is preferable that the mounting face 25 for mounting the light-emitting element 9 is provided in the central portion C (the range illustrated using a dotted frame in FIG. 4B) of the space portion 24. When the mounting face 25 is provided in the central portion C of the space portion 24, the distance from the space portion 24 to the outer faces of the bottom base material 22, the wall members 23, and the lid 28 becomes equal in all directions. As a result, there is improvement in the balance of heat dissipation, and there is a decrease the location-dependent temperature difference in the light-emitting element 9. As a result, light emission can be performed in a stable manner. In this case too, a long product life of the light-emitting device B1 that includes the light-emitting element housing member A3, can be achieved. When viewed from the side of the opening 27, the central portion C of the space portion 24 where the mounting face 25 is positioned is present at the central position in the height direction of the wall members 23.

Moreover, in the light-emitting element housing member A3 according to the third embodiment, it is preferable that, of the mounting part 26, an end face 26a present on the side of the opening 27 is perpendicular to the mounting face 25. Moreover, it is preferable that the mounting face 25 and the end face 26a are linked via a right-angled corner. When the mounting face 25 and the end face 26a form a right angle, it becomes easy to position the light-emitting face 9a of the light-emitting element 9 in alignment with the end face 26a of the mounting part 26; and the light emitted from the light-emitting element 9 does not easily reflect from the end face 26a. As a result, it becomes possible to enhance the directionality and the intensity of the light.

Also in the case of the light-emitting device B1 according to the first embodiment, it is preferable that the light-emitting element 9, excluding the light-emitting face 9a, contacts the mounting face 25. However, if the thickness is equal to or smaller than 50 μm, then the light-emitting element 9 can be bonded to the mounting face 25 using a filling material doubling as a jointing material.

Regarding the lid 28 constituting the light-emitting device B1 according to the first embodiment, with the aim of achieving high thermal conductivity, it is suitable to use a ceramic (for example, aluminum nitride), or a metal (for example, kovar), or a composite material of a ceramic and a metal. In that case too, from the perspective of enhancing the thermal conductivity, it is preferable that the light-emitting element 9, excluding the light-emitting face 9a thereof, contacts the lid 28. When the light-emitting element 9 is bonded using a filling material doubling as a jointing material, it is preferable that the thickness of the jointing material is equal to or smaller than 50 μm from the perspective of heat dissipation.

As described above, in the light-emitting element housing member A3 according to the third embodiment, the bottom base material 22, the wall members 23, and the mounting part 26 are integrally formed using a ceramic.

The conventional semiconductor laser device 50 illustrated in FIG. 24B is configured with the metallic stem block 55 and the metallic stem base 53. The stem block 55 and the stem base 53 that constitute the conventional semiconductor laser device 50 illustrated in FIG. 24B have the coefficient of thermal expansion to be equal to $7-30\times10^{-6}/°$ C.

The ceramic constituting the light-emitting element housing member A3 according to the third embodiment has the coefficient of thermal expansion to be equal to $4-6\times10^{-6}/°$ C.

As against the conventional semiconductor laser device 50; in the light-emitting element housing member A3, the bottom base material 22, the wall members 23, and the mounting part 26 are integrally formed using a ceramic having a low coefficient of thermal expansion. Hence, even if the bottom base material 22, the wall members 23, and the mounting part 26 are subject to heat cycles of heating and cooling due to light emission from the light-emitting element 9, there is only a small fluctuation in the dimensions of the base material. As a result, it becomes possible to reduce the fluctuation in the optical axis of the light-emitting element 9.

Meanwhile, the light-emitting element housing member A3 according to the third embodiment includes a via conductor (not illustrated) that penetrates through the mounting part 26 in the thickness direction. In this case, the direction of penetrating through the thickness direction of the mounting part 26 implies the direction of the opening 27 parallel to the end face 26a. The via conductor represents the component for supplying electrical power to the light-emitting element 9 that is installed in the mounting part 26. Moreover, since the via conductor also has the function of a thermal via, the heat dissipation capacity of the mounting part 26 can also be enhanced.

Meanwhile, in the case of providing a heat dissipation member on the reverse side of the bottom base material 22, it is preferable that the via conductor is bent midway through the thickness direction of the mounting part 26 and is guided toward the side of the wall members 23 that is on the opposite side of the opening 27. In the case where the via conductor is bent midway through the thickness direction of the mounting part and is guided toward the side of the wall members 23 on the opposite side of the opening 27, the heat dissipation member can be placed over the entire reverse side of the bottom base material 22, thereby enabling achieving further enhancement in the heat dissipation.

Moreover, in the light-emitting element housing member A3 according to the third embodiment, a via conductor or a metal pad for covering the via conductor is present in the mounting part 26. If the light-emitting element housing member A3 includes a via conductor, it becomes possible to shorten the conductor length of a bonding wire for establishing electrical connection with the light-emitting element 9. As a result, the amount of metallic material having metallic luster, such as the bonding wire, on the mounting part 26 can be reduced in the space portion 24.

In this case, it is preferable that the bottom base material 22, the wall members 23, and the mounting part 26 have a blackish color tone. Herein, a blackish color tone also implies a color formed by mixing brown color or deep blue color. If the bottom base material 22, the wall members 23, and the mounting part 26 have a blackish color tone; then, in combination with the fact that there is only a small amount of metallic material having metallic luster, such as a bonding wire, in the space of the mounting part 26, diffused reflection is further held down. That makes it possible to achieve the light-emitting element housing member A3 having a high degree of luminescent performance. In this case, in the light-emitting element housing member A3, it is preferable that the ratio of a ceramic with respect to the total volume is equal to or greater than three-quarters by volume.

Fourth Embodiment

Figure 5A:
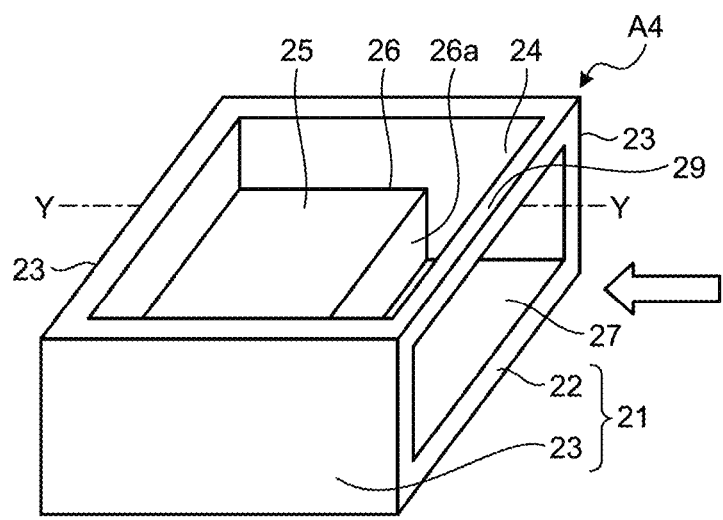
FIG. 5A is a perspective view illustrating a light-emitting element housing member according to a fourth embodiment.
Figure 5B:
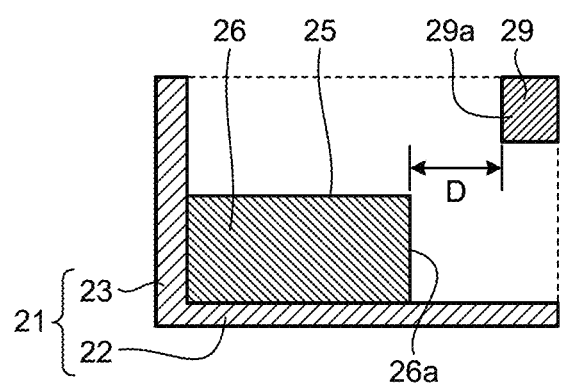
FIG. 5B is a cross-sectional view along line Y-Y in FIG. 5A.
Figure 6A:
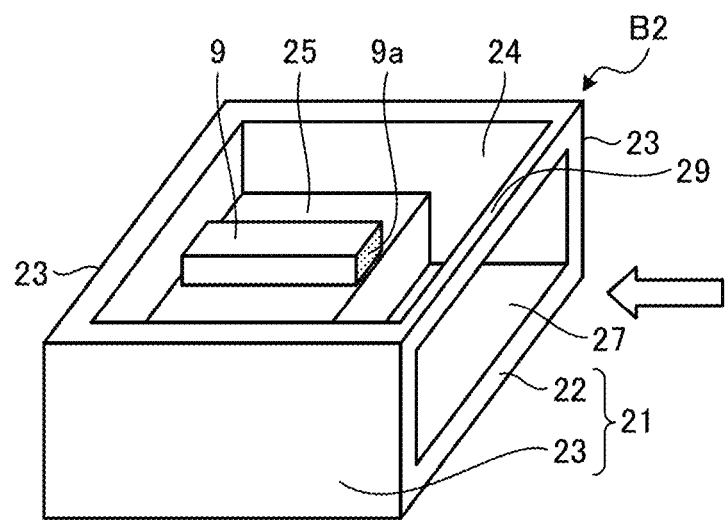
FIG. 6A is a schematic diagram illustrating a light-emitting device according to the second embodiment.
Figure 6B:
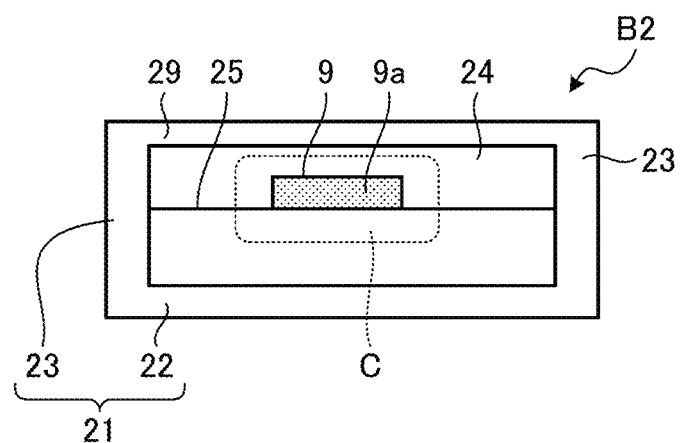
FIG. 6B is a plan view of FIG. 6A when viewed from the side of the opening (from the direction of an arrow illustrated in FIG. 6A).

FIG. 5A is a perspective view of a light-emitting element housing member A4 according to a fourth embodiment, and FIG. 5B is a cross-sectional view along line Y-Y in FIG. 5A. FIG. 6A is a schematic diagram illustrating a light-emitting device B2 according to the second embodiment, and FIG. 6B is a plan view of FIG. 6A when viewed from the side of the opening (from the direction of an arrow illustrated in FIG. 6A). The light-emitting device B2 according to the second embodiment as illustrated in FIGS. 6A and 6B is a perspective view illustrating the state where the lid 28 (see FIG. 4A) is placed in the light-emitting element housing member A4 according to the fourth embodiment as illustrated in FIGS. 5A and 5B and the light-emitting element 9 is installed inside. With reference to FIGS. 6A and 6B, the light-emitting face is referred to by the reference numeral 9a.

As compared to the light-emitting element housing member A3 according to the third embodiment as illustrated in FIGS. 3A and 3B, the light-emitting element housing member A4 according to the fourth embodiment as illustrated in FIGS. 5A and 5B differs in the way that a bridge member 29 is disposed in between the wall members 23 and close to the opening 27. In this case, for the reason that the mechanical strength with the wall members can be enhanced, it is preferable that the bridge member 29 is integrally formed without involving any bonded surface.

In the light-emitting element housing member A4 according to the fourth embodiment, in addition to achieving the identical effects to the effects obtained as a result using the light-emitting element housing member A3 according to the third embodiment, the heat dissipation can be enhanced by the amount equivalent to the increase in the surface area attributed to the bridge member 29. That is, as a result of disposing the bridge member 29 on the side of the opening 27, when the light-emitting element 9 is driven and the light-emitting element housing member A4 produces heat; in the light-emitting element housing member A3, the bridge member 29 is disposed in the portion where simply a space was present so that the heat from the wall members 23 that are present at the opposite positions across the opening 27, diffuses toward the bridge member 29, and the heat dissipation from the entire substrate 21 can be improved.

As illustrated in FIGS. 5A and 5B, if the bridge member 29 is disposed at the position across the wall member 23 on the side of the opening 27, even in the case where the substrate 21 is subject to temperature variation due to heating and cooling and the wall member 23 on the side of the opening 27 becomes easily warpable due to thermal expansion and thermal contraction, the warping of that portion of the wall member 23 can be reduced. As a result, the variation in dimensions can be reduced even if the substrate 21 produces heat, and the axial runout and fluctuation of the optical axis in the light-emitting direction of the light-emitting element 9 can be reduced.

Moreover, in the light-emitting element housing member A4 according to the fourth embodiment as illustrated in FIGS. 5a and 5B, it is preferable that the end face 26a of the mounting part 26 is positioned on or inward of a side face 29a of the bridge member 29 on the side of the mounting face 25 (i.e., positioned at the position where a normal is dropped on the bottom base material 22 along the face of the side face 29a). In that case, regarding a clearance gap D between the end face 26a of the mounting part 26 and the side face 29a of the bridge member 29, although dependent on the size of the substrate 21, it is preferable to have the clearance gap D to be equal to or smaller than 2 mm if based on the size of a specific example (described later).

Fifth Embodiment

Figure 7:
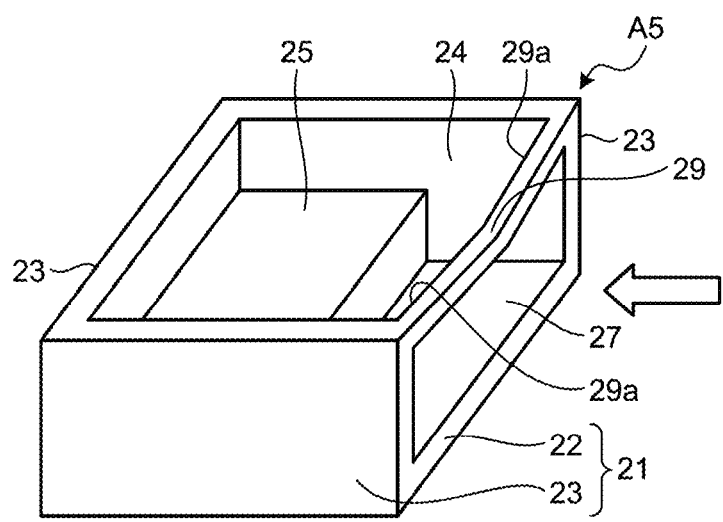
FIG. 7 is a perspective view illustrating a light-emitting element housing member according to a fifth embodiment.
Figure 8A:
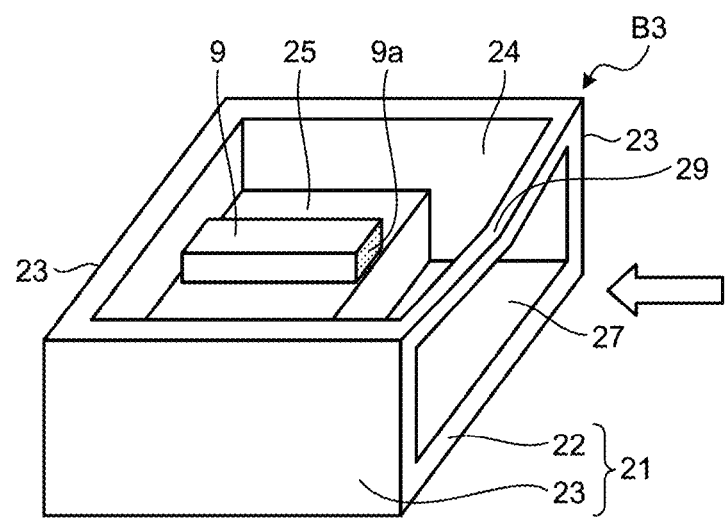
FIG. 8A is a schematic diagram illustrating a light-emitting device according to the third embodiment.
Figure 8B:
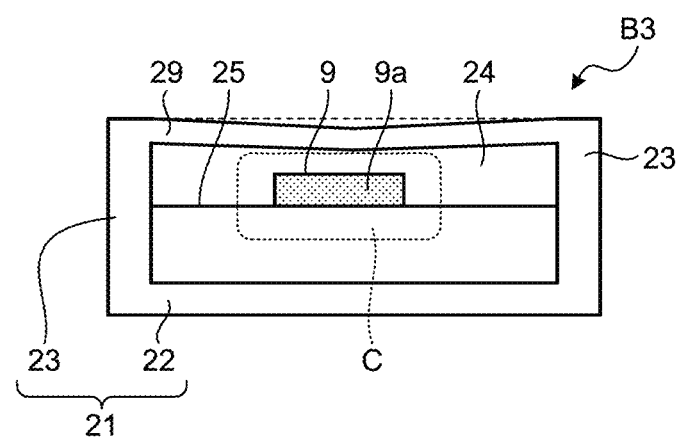
FIG. 8B is a plan view for FIG. 8A when viewed from the side of the opening (the direction of an arrow illustrated in FIG. 8A).

FIG. 7 is a perspective view of a light-emitting element housing member A5 according to a fifth embodiment. FIG. 8A is a schematic diagram illustrating a light-emitting device B3 according to the third embodiment, and FIG. 8B is a plan view of FIG. 8A when viewed from the side of the opening (the direction of an arrow illustrated in FIG. 8A). In the light-emitting device B3 according to the third embodiment as illustrated in FIGS. 8A and 8B, the bridge member 29 that is present in the light-emitting element housing member A4 according to the fourth embodiment as illustrated in FIGS. 5A and 5B is convexly curved toward the bottom base material 22. With reference to FIGS. 8A and 8B, the light-emitting face is referred to by the reference numeral 9a.

Regarding the difference between the light-emitting element housing member A5 according to the fifth embodiment as illustrated in FIG. 7 and the light-emitting element housing member A4 according to the fourth embodiment; the bridge member 29 in the light-emitting element housing member A4 according to the fourth embodiment has an almost straight shape between the wall members 23, but the bridge member 29 in the light-emitting element housing member A5 according to the fifth embodiment is convexly curved toward the bottom base material 22 as described earlier.

Meanwhile, in FIGS. 7, 8, and 8B too, in an identical manner to the case in FIGS. 5A, 5B, 6A, and 6B; it is preferable that the bridge member 29 is integrally formed between the wall members 23.

In the light-emitting element housing member A5 according to the fifth embodiment, in addition to achieving the identical effects to the effects obtained by using the light-emitting element housing member A4 according to the fourth embodiment, as compared to the bridge member 29 illustrated in FIGS. 5A, 5B, 6A, and 6B; the bridge member 29 becomes longer by the length equivalent to the portion that is convexly curved toward the bottom base material 22. For that reason, the surface area of the bridge member 29 increases, and thus the heat dissipation capacity thereof can be enhanced. Moreover, as described earlier, since the bridge member 29 is convexly curved toward the bottom base material 22, the apex of the convex curvature can be set as the rough indication of the optical axis of the light-emitting element 9.

Meanwhile, as an additional effect, although dependent on the elastic modulus of the material of the bridge member 29, if the bridge member 29 is convexly curved toward the bottom base material 22, when the substrate 21 is heated and the wall member 23 undergoes deformation toward, for example, the space portion 24; the wall member 23 becomes easily bendable with the position of maximum curvature of the bridge member 29 serving as the pivot point. As a result, it becomes possible to reduce the heat stress generated in the light-emitting element housing member A5 where the bridge member 29 is included in the substrate 21 (the bottom base material 22 and the wall member 23).

Since the substrate 21 enables achieving the effects as described above, for example, it becomes possible to alleviate the heat stress generated at the time of brazing the lid 28 (in FIG. 8A, not illustrated) to the light-emitting element housing member A5. As a result, it becomes possible to prevent the light-emitting element housing member A5 from breaking. That is, in the light-emitting device B3 according to the third embodiment, since the heat stress at the time of brazing of the lid 28 can be reduced, it becomes possible to reduce the thickness of the brazing material at the time of brazing the lid 28 to the light-emitting element housing member A5. As a result, not only the usage amount of the brazing material can be reduced, but the height of the light-emitting device B3 can also be reduced.

Figure 8C:
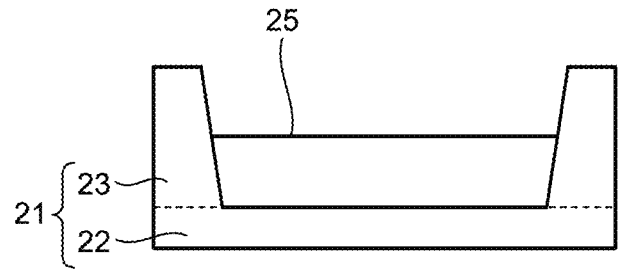
FIG. 8C is a schematic diagram illustrating, as a variation of the second to fourth embodiments, a light-emitting element housing member that includes a wall member with a thickness that decreases from the side of the bottom base material to the side of the top face.

Regarding the wall members 23 constituting the light-emitting element housing members A3 to A5, it is preferable that the thickness of the wall members 23 decreases from the bottom base material 22 to the top face as illustrated in FIG. 8C. As a result of such a shape of the wall members 23, even when the wall members 23 become easily warpable and thus come under load during the brazing process, it becomes possible to prevent the wall members 23 from breaking. In this case, the face of the wall members 23 on the side of the mounting part 26 can be inclined with respect to the face of the mounting part 26, and the opposite face of the wall members 23 can be almost perpendicular with respect to the bottom base material 22 (or the mounting part 26).

Herein, regarding the size of each member constituting the substrates 1 and 21 described above, in the states illustrated in FIG. 1A to FIG. 1E, when the diameter is approximately 1 mm to 2 mm, when the height is approximately 1 mm to 2 mm, and when the configuration is as illustrated in FIG. 2; it is preferable that the length of one side is equal to 1 mm to 2 mm.

In the states illustrated in FIGS. 3A to 8B, it is preferable that the area of the bottom base material 22 is in the range of 1 mm$^2$ to 10 mm$^2$, the height from the bottom face of the bottom base material 22 to the top face of the wall members 23 is in the range of 0.2 mm to 1 mm, and the thickness of the wall members 23 is in the range of 0.05 mm to 1 mm.

Meanwhile, in the following explanation, the light-emitting element housing members A3 to A5 illustrated in FIGS. 3A to 8B are sometimes called light-emitting element housing boards.

Moreover, in the light-emitting element housing member A5 illustrated in FIG. 7 and the light-emitting device B3 illustrated in FIGS. 8A and 8B, it is preferable that the amount of deformation of the bridge member 29 is in the range of 10 μm to 200 μm toward the bottom base material 22 from the state where the bridge member 29 is positioned straight.

Regarding the ceramic constituting the light-emitting element housing members A1 to A5 according to the first to fifth embodiments described above, it is suitable to use a ceramic material having high thermal conductivity. However, from the fact that the coefficient of thermal expansion of aluminum nitride is close to that of a laser diode, a material based on aluminum nitride is more suitable from among various ceramic materials.

Meanwhile, in the substrate 1 or the substrate 21, usually, a conductor is formed for supplying electricity to the light-emitting element 9. Moreover, the conductor can be made to function also as a heat dissipating member. In that case, for example, in the bottom base material 22 constituting the substrate 21, when a conductor is formed through the bottom base material 22; it is advantageous if the width of the conductor is set to be in the range of one-fourth to half of the width of the light-emitting element 9, or it is advantageous if a plurality of dummy conductors not supplying electricity is disposed near the mounting part 11 or the mounting part 26.

Then, if a conductor is formed in any one of the light-emitting element housing member A1 to A5 according to the first to fifth embodiments and if a glass window is fit to the opening 5 or the opening 27 in the concerned light-emitting element housing member from among the light-emitting element housing members A1 to A5; then the concerned light-emitting element housing member from among the light-emitting element housing members A1 to A5 itself substitutes for the stem block and the stem base. As a result, it becomes possible to configure a light-emitting device that enables achieving a high degree of heat dissipation and achieving downsizing.

Figure 8D:
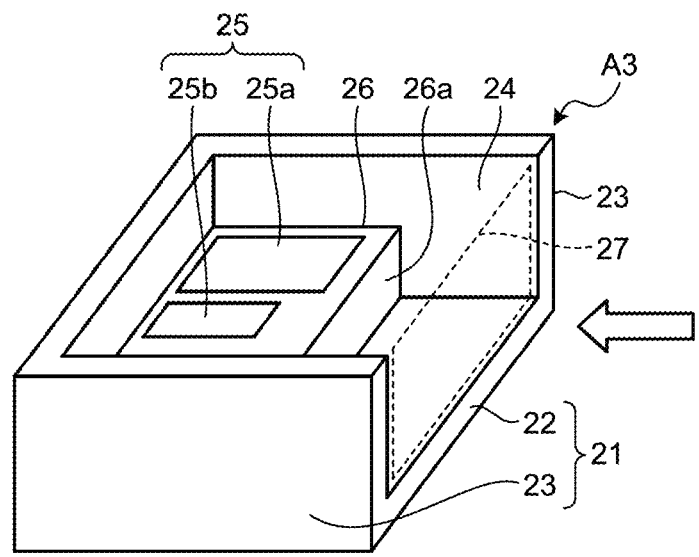
FIG. 8D is a schematic diagram illustrating a light-emitting element housing member where a mounting part includes a first mounting part for a laser diode and a second mounting part for a photodiode.

Moreover, in the light-emitting element housing members A1 to A5 according to the first to fifth embodiments; as illustrated in FIG. 8D, it is also possible to have a structure where the mounting face 25 for the mounting of a laser diode that represents the light-emitting element 9, is provided as a first mounting part 25a, and the adjacent mounting face 25 for the mounting of a photodiode is provided as a second mounting part 25b. In that case, the second mounting part 25b for mounting a photodiode can be provided on the posterior side of the first mounting part 25a that represents the opposite side to the opening 5 or the opening 27 in the concerned light-emitting element housing member from among the light-emitting element housing members A1 to A5. However, alternatively, for example, if the second mounting part 25b for mounting a photodiode and the first mounting part 25a for mounting a laser diode are provided in parallel toward the direction of the opening 27 as illustrated in FIG. 8D, the light-emitting face 9a of the photodiode can be provided on the side of the opening 5 or the opening 27 as well as can be provided on the opposite side too, and a light-emitting device having a higher degree of general versatility can be obtained. In that case, in the concerned light-emitting element housing member from among the light-emitting element housing members A1 to A5, a second opening is formed on the wall member 23 present on the opposite side of the opening 5 or the opening 27.

Figure 8E:
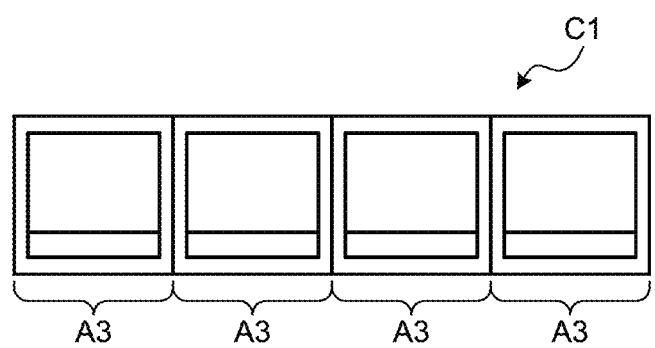
FIG. 8E is a plan view of an array member according to the present embodiment.

FIG. 8E is a plan view of an array member according to the embodiments. An array member C1 illustrated in FIG. 8E is formed by joining a plurality of light-emitting element housing members A3 from among the various light-emitting element housing members described above.

In any one of the light-emitting element housing members A1 to A5 described above, the substrate 1 or the substrate 21 is of the integrated ceramic type, and does not represent a pin structure as in the conventional semiconductor laser device 50 illustrated in FIGS. 24A and 24B. Hence, it becomes possible to achieve a lower height and a smaller size of the concerned light-emitting element housing member.

Even when the structure is such that the light-emitting element housing members A1 to A5 are joined, it is still possible to have a multichip configuration while maintaining the thickness of the substrates 1 and 21. Thus, it becomes possible to obtain a compact light-emitting device where a plurality of light-emitting elements 9 is integrated. In that case, the substrates 1 and 21 in the joined light-emitting element housing members A1 to A5 are sintered into an integrated state. Hence, as compared to the case where the substrates 1 and 21 in the joined light-emitting element housing members A1 to A5 are joined using some other material such as a jointing material that is other than the material constituting the substrates 1 and 21; the in-plane thermal conductivity becomes higher, and an array-type light-emitting device having a high degree of heat dissipation and a high degree of strength can be obtained.

Figure 9:
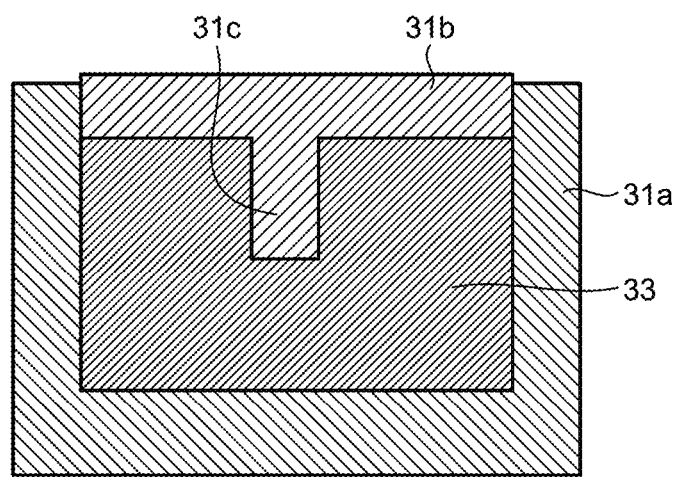
FIG. 9 is a cross-sectional schematic diagram illustrating a method for manufacturing the light-emitting element housing members according to the first and second embodiments.

Given below is the explanation of a method for manufacturing the light-emitting element housing members A1 to A5 and the light-emitting devices B1 to B3 described above. FIG. 9 is a cross-sectional schematic diagram illustrating a method for manufacturing the light-emitting element housing member A1 according to the first embodiment and the light-emitting element housing member A2 according to the second embodiment. In the case of preparing a compact to be used in the light-emitting element housing member A1 according to the first embodiment; as a lower-side mold 31a, the inside portion of the mold 31a is hollowed out in a cylindrical shape. In the case of manufacturing a compact to be used in the light-emitting element housing member A2 according to the second embodiment; as the lower-side mold 31a, the inside portion of the mold 31a is hollowed out in the shape of a hexahedron. As far as an upper-side mold 31b is concerned, as long as the upper-side mold 31b has a salient portion 31c where the desired opening 5 and the desired space portion 7 can be formed, it serves the purpose.

Firstly, as the ceramic material of the substrates 1 and 21, aluminum nitride is used as the major component, and a mixed powder is prepared by including an oxidized material of a rare-earth element (for example, yttria ($Y_2O_3$), calcia (CaO), or erbia ($Er_2O_3$)) in aluminum nitride. Herein, using aluminum nitride as the major component implies that aluminum nitride of 80 mass percent or higher is included in the substrates 1 and 21. Meanwhile, from the perspective of being able to achieve the coefficient of thermal conductivity of 150 W/m or higher, it is preferable that aluminum nitride of 90 mass percent or higher is included in the substrates 1 and 21. In this way, the substrates 1 and 21 are shaped by sintering a ceramic material such as aluminum nitride, and are thus configured with the sintered compact of ceramic particles.

Subsequently, the mixed powder is used to prepare a compact 33 to be used for the substrate 1 in the light-emitting element housing member A1 according to the first embodiment and the light-emitting element housing member A2 according to the second embodiment. In the case of preparing the compact 33 representing the light-emitting element housing member A1 according to the first embodiment and the light-emitting element housing member A2 according to the second embodiment, a wax for press molding is impregnated in the mixed powder, and the compact 33 is prepared in a cylindrical shape or a hexahedron shape using the mold 31a or the mold 31b of a predetermined shape. Meanwhile, as far as the methods for forming the space portion 7 in the substrate 1 are concerned, apart from the abovementioned method of integrally preparing a compact using a mold of a predetermined shape, a solid compact can be prepared and burnt and then subjected to cutting work.

FIGS. 10A to 10D are schematic diagrams illustrating a method for manufacturing the light-emitting element housing member A3 according to the third embodiment.

Figure 10A:
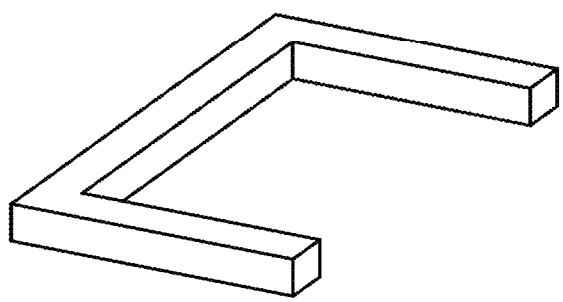
FIG. 10A is a schematic diagram (1) illustrating a method for manufacturing the light-emitting element housing member according to the third embodiment.
Figure 10B:
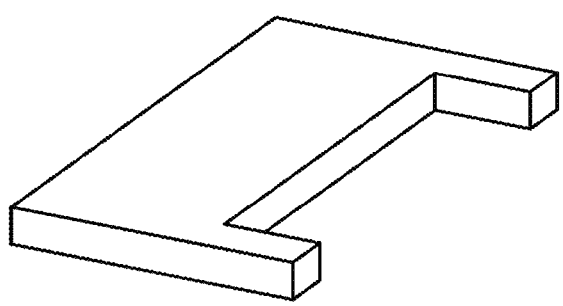
FIG. 10B is a schematic diagram (2) illustrating a method for manufacturing the light-emitting element housing member according to the third embodiment.
Figure 10C:
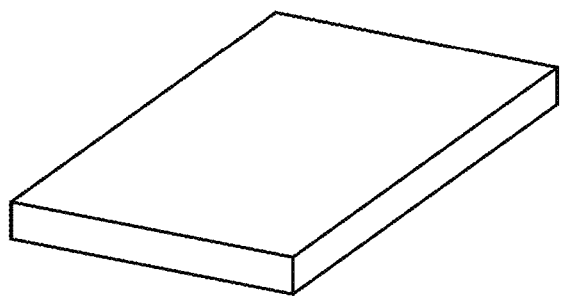
FIG. 10C is a schematic diagram (3) illustrating a method for manufacturing the light-emitting element housing member according to the third embodiment.
Figure 10D:
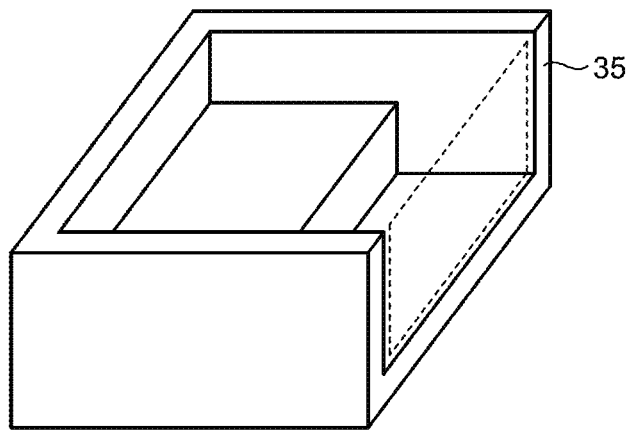
FIG. 10D is a schematic diagram (4) illustrating a method for manufacturing the light-emitting element housing member according to the third embodiment.

In the case of preparing a compact (hereinafter, called a laminated compact) for the light-emitting element housing member A3 according to the third embodiment; for example, it is preferable to implement a method where a plurality of green sheets that is processed in advance in predetermined shapes is used as illustrated in FIGS. 10A to 10D. In that case, green sheets are prepared by adding a predetermined organic vehicle to the mixed powder mentioned above. Then, in some green sheets, a through hole is formed that represents the space portion 24 (pattern sheets illustrated in FIGS. 10A and 10B). Subsequently, the pattern sheets having a through hole formed therein are laminated with a green sheet where no through hole is formed (a pattern sheet illustrated in FIG. 10C). As a result, a laminated compact 35 illustrated in FIG. 10D is prepared.

Figure 11A:
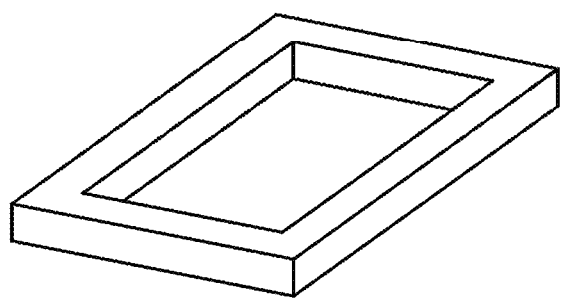
FIG. 11A is a schematic diagram (1) illustrating a method for manufacturing the light-emitting element housing member according to the fourth embodiment.
Figure 11B:
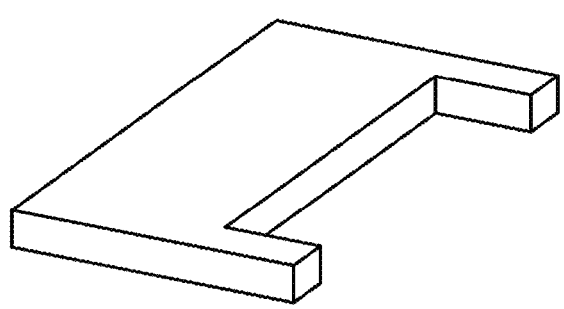
FIG. 11B is a schematic diagram (2) illustrating a method for manufacturing the light-emitting element housing member according to the fourth embodiment.
Figure 11C:
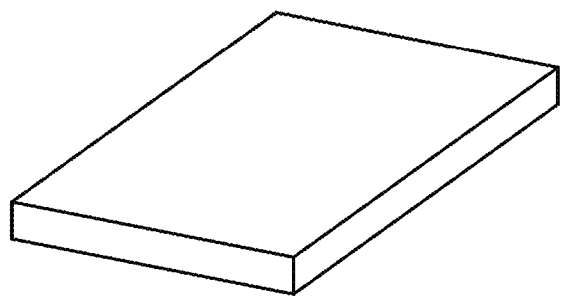
FIG. 11C is a schematic diagram (3) illustrating a method for manufacturing the light-emitting element housing member according to the fourth embodiment.

FIGS. 11A to 11D are schematic diagrams illustrating a method for manufacturing the light-emitting element housing member A4 according to the fourth embodiment. In the case of preparing a laminated compact for the light-emitting element housing member A4 according to the fourth embodiment, it is preferable to use a green sheet where a through hole is hollowed out as a hollow square as illustrated in FIG. 11A.

Figure 11D:
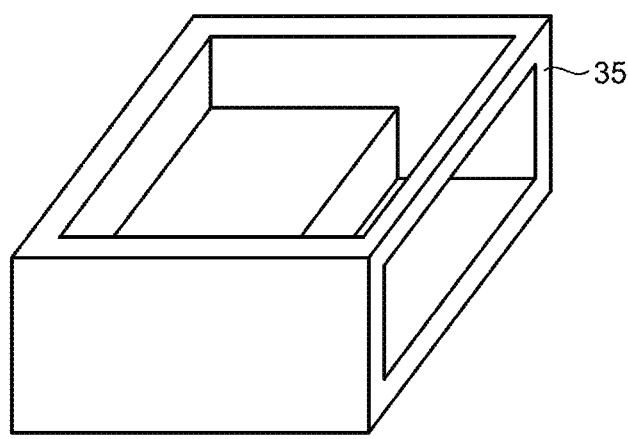
FIG. 11D is a schematic diagram (4) illustrating a method for manufacturing the light-emitting element housing member according to the fourth embodiment.

Meanwhile, in the case of preparing a laminated compact for the light-emitting element housing member A5 according to the fifth embodiment, after a laminated compact illustrated in FIG. 11D is prepared, the portion representing the bridge member 29 can be heated and subjected to plastic deformation toward the lower side. Besides, the method illustrated in FIG. 9 and FIGS. 10A to 10D can be implemented, and the substrate 21 can be formed by integrating the bottom base material 22 and the wall member 23, along with the bridge member 29 in some cases.

Although not illustrated in FIGS. 9 to 11D, in the compact 33 or the laminated compact 35, in or around the portion representing the mounting part 11 or the mounting part 26 in the light-emitting element 9, a conductor is formed for supplying electric power to the light-emitting element 9, and the conductor is made to pass through the inside and outside of the compact 33 or the laminated compact 35 and is made to communicate with a conductor representing an electrode terminal formed on the outside surface of the compact 33 or the laminated compact 35. As described later, a conductor can be a via hole, an internal wiring pattern, a surface layer wiring pattern, a seal ring connection pattern, and an electrode terminal.

Subsequently, the prepared compact 33 or the prepared laminated compact 35 is burnt under predetermined burning conditions, so that the substrate 1 or the substrate 21 representing one of the light-emitting element housing members A1 to A5 according to the embodiments can be obtained.

As far as the burning conditions at the time of preparing the substrate 1 or the substrate 21 is concerned, when a mixed powder having aluminum nitride as the major component is used, it is preferable to have the temperature in the range of 1700° C. to 2000° C. in a reducing atmosphere.

Sixth Embodiment

Figure 12:
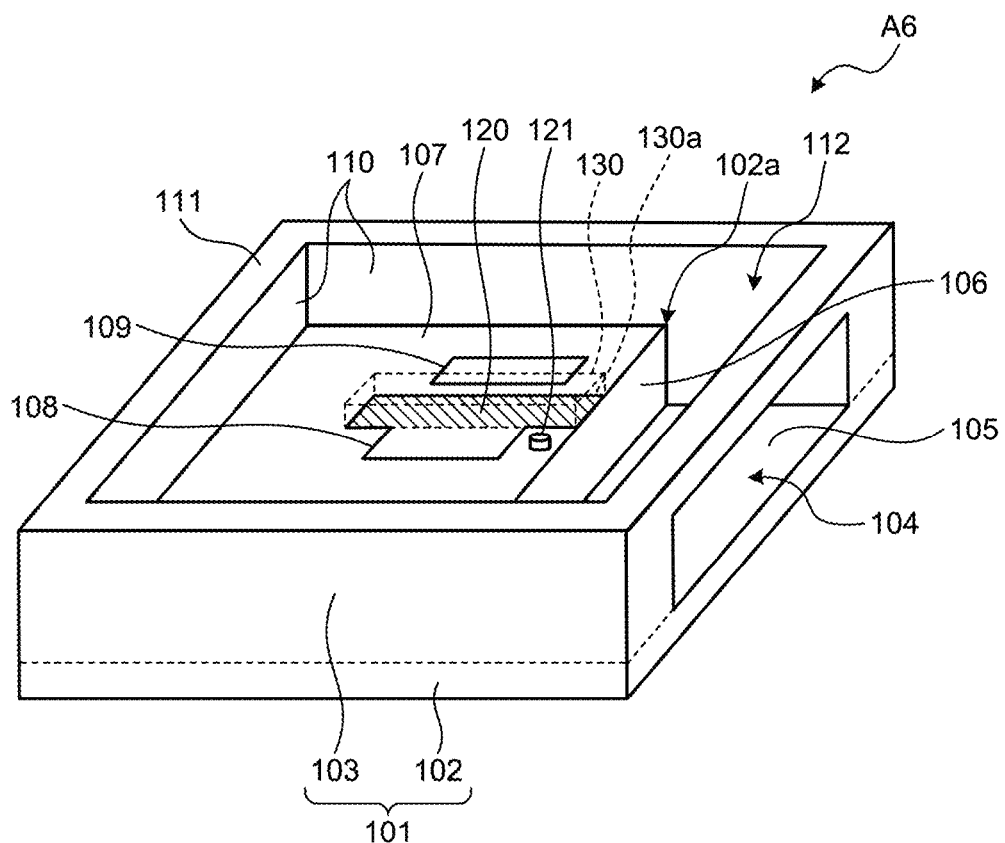
FIG. 12 is a perspective view of a light-emitting element housing member according to a sixth embodiment.

FIG. 12 is a perspective view of a light-emitting element housing member A6 according to a sixth embodiment.

The light-emitting element housing member A6 according to the sixth embodiment includes a substrate 101. The substrate 101 is configured with a bottom base material 102 that has a rectangular shape in planar view, and a wall member 103 that is placed on the bottom base material 102; and has a box-type structure that internally includes a space for enabling passage of the light emitted from a light-emitting element 130 illustrated using dashed lines.

The bottom base material 102 has a pedestal portion 102a formed in the upper part thereof. On a mounting face 107 representing the top face of the pedestal portion 102a, a mounting part 120 is disposed where the light-emitting element 130 is mounted.

Moreover, the light-emitting element 130 has a light emitting face 130a formed thereon to face an opening 104 of the substrate 101. The light emitted from the light-emitting face 130a of the light-emitting element 130 is channelized to the outside via the internal space and the opening 104.

In the substrate 101 that constitutes the light-emitting element housing member A6 according to the sixth embodiment, a positioning mark 121 is provided around the mounting part 120 for the purpose of determining the mounting position of the light-emitting element 130. As a result of determining the position of the light-emitting element 130 using the positioning mark 121, the positioning of the light-emitting element 130 in the mounting part 120 can be performed with a higher degree of accuracy.

Thus, even in the case where the light-emitting element 130 such as a semiconductor laser having an elongated shape is installed in the substrate 101, the optical axis of the light emitted from the light-emitting face 130a can be aligned with ease.

Herein, it is preferable that the positioning mark 121 has a concave shape or a convex shape formed integrally with the substrate 101. If a stereoscopic mark having a concave shape or a convex shape is used as the positioning mark 121; then, at the time of reading the positioning mark 121 from above using a CCD camera, the edges of the positioning mark 121 can be detected in a vivid way. Since the position of the positioning mark 121 can be detected with a higher degree of accuracy, the position of the light-emitting element 130 can be determined with a higher degree of accuracy based on the positioning mark 121.

Meanwhile, as a result of providing the positioning mark 121 integrally with the substrate 101 and using the same material as the substrate 101, during the press work performed in the manufacturing process of the substrate 101 (described later), the positioning mark 121 can be formed with ease. As a result, it becomes possible to hold down an increase in the manufacturing cost of the substrate 101.

As far as the stereoscopic shape of the positioning mark 121 is concerned, from the standpoint of enabling easy recognition of the position, it is suitable to have the positioning mark 121 in at least one shape among the cylindrical shape, the conical shape, the prismatic shape, and the pyramidal shape. Moreover, for the reason that the location is easily identifiable even if some part of the shape becomes unclear, it is desirable to have the positioning mark 121 in the cylindrical shape.

Meanwhile, the sixth embodiment is not limited to the case where the positioning mark 121 is formed integrally with the substrate 101. Alternatively, the positioning mark 121 can be configured as a separate member from the substrate 101. Moreover, the shape of the positioning mark 121 is not limited to a stereoscopic shape, and alternatively can be a planar shape. The positioning mark 121 having a planar shape can be formed according to, for example, a printing process.

Given below with reference to FIG. 12 is the explanation of the further detailed configuration of the substrate 101.

The substrate 101 is made of a ceramic. Although it is possible to use various types of ceramics in the substrate 101, it is desirable to use aluminum nitride (AlN) as the major component because it has high thermal conductivity and has the coefficient of thermal expansion to be close to the light-emitting element 130.

Herein, using aluminum nitride as the major component implies that aluminum nitride of 80 mass percent or higher is included in the substrate 101. If the aluminum nitride of less than 80 mass percent is included in the substrate 101, then there is a decline in the coefficient of thermal expansion, thereby possibly leading to diminished heat dissipation of the heat produced from the light-emitting element 130 to the outside.

Moreover, it is desirable that aluminum nitride of 90 mass percent or higher is included in the substrate 101. As a result of having aluminum nitride of 90 mass percent or higher in the substrate 101, the coefficient of thermal conductivity of the substrate 101 can be set to 150 W/m or higher, and the light-emitting element housing member A6 having excellent heat dissipation capacity can be obtained.

As described above, the substrate 101 is configured with the bottom base material 102 and the wall member 103. Moreover, the bottom base material 102 has the pedestal portion 102a formed in the upper part thereof, and the wall member 103 is placed to enclose three sides of the pedestal portion in a U-shaped manner in planar view. Moreover, the opening 104 is formed to face the remaining one side of the pedestal portion 102a.

A bottom face 105 of the bottom base material 102 contacts the opening 104, is substantially parallel to the mounting face 107 of the pedestal portion 102a, and is formed at a raised position than the mounting face 107. Moreover, the bottom face 105 is formed in between the lower portion of the opening 104 and the lower portion of an LD mounting end face 106 representing a side face of the pedestal portion 102a.

The LD mounting end face 106 that contacts the bottom face 105 is formed substantially parallel to that side face of the substrate 101 where the opening 104 is formed thereon. The LD mounting end face 106 is used in the positioning of the light-emitting element 130. More particularly, when the substrate 101 is viewed in planar view, the light-emitting element 130 is positioned in such a way that the position of the light-emitting face 130a of the light-emitting element 130 is aligned with the position of the LD mounting end face 106.

On the mounting face 107 that is the top face of the pedestal portion 102a, apart from providing the mounting part 120 and the positioning mark 121, a first connection terminal 108 and a second connection terminal 109 are disposed. The first connection terminal 108 is disposed to overlap at least a part of the mounting part 120.

When the light-emitting element 130 is mounted in the mounting part 120, the first connection terminal 108 gets electrically connected to a first electrode (not illustrated) that is disposed on the bottom face of the light-emitting element 130, using solder. The second connection terminal 109 gets connected to, for example, a second electrode (not illustrated) that is disposed on the top face of the light-emitting element 130, using a bonding wire (not illustrated).

The wall member 103 that is placed on the bottom base material 102 has cavity wall faces 110 and a wall top face 111. The cavity wall faces 110 are side faces on the inside of the wall member 103, and the wall top face 111 is the top face of the wall member 103.

Moreover, in the substrate 101, a top-face opening 112 is formed that is enclosed by the wall member 103 on the top face side. As a result of forming the top-face opening 112 in the substrate 101, the mounting part 120 and the positioning mark 121 can be read through the top-face opening 112 using a CCD camera. Besides, the light-emitting element 130 can be carried into the mounting part 120 through the top-face opening 112.

Meanwhile, regarding the size of the substrate 101, the width and the length can be in the range of about 2 mm to 5 mm, and the height can be in the range of about 0.2 mm to 1 mm. Herein, the "width" implies the dimensions of the side that is substantially perpendicular to the horizontal direction and the optical axis direction of light. The "length" implies the dimensions of the side that is substantially parallel to the horizontal direction and the optical axis direction of light. (The same meaning is applicable in the following explanation).

<Example of Arrangement of Positioning Marks)

Explained below with reference to FIGS. 13A to 13H are working examples of various types of arrangement of the positioning marks 121 in the substrate 101 according to the sixth embodiment, and the details of the method for positioning the light-emitting element 130 in each working example.

With reference to FIGS. 13A to 13H, initially the explanation is given for a working example where a single positioning mark 121 is disposed around the mounting part 120, and then the explanation is given for working examples where the number of positioning marks 121 is gradually increased.

Figure 13A:
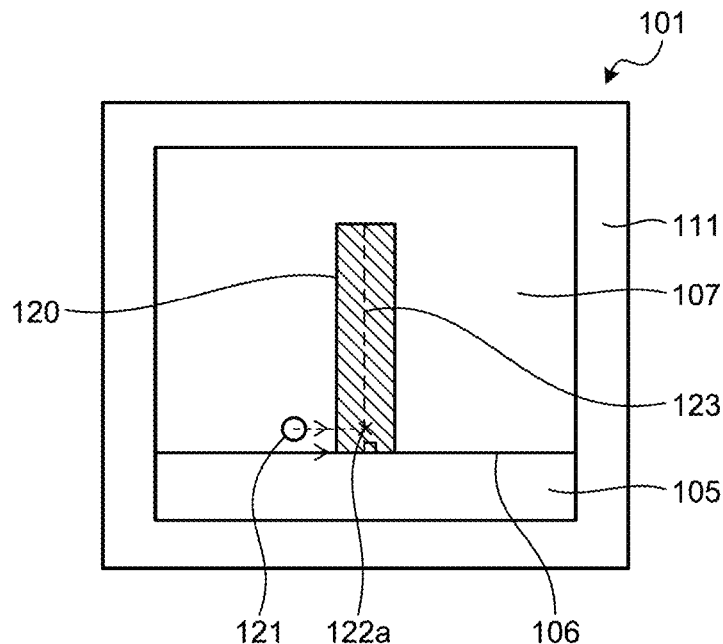
FIG. 13A is a plan view illustrating a first working example of arrangement of positioning marks provided in the substrate according to the sixth embodiment.

In FIG. 13A is illustrated a working example where a single positioning mark 121 is disposed around the mounting part 120. The method for positioning the light-emitting element 130 (see FIG. 12) according to this working example is as follows.

Firstly, the positions of the mounting part 120, the positioning mark 121, and the LD Mounting end face 106 are read from above the substrate 101 using a CCD camera. Then, based on the position of the positioning mark 121, the position of an origin 122a in the mounting part 120 is identified. The origin 122a is present on the straight line that is parallel to the LD mounting end face 106 and that passes through the positioning mark 121, and represents a point present at a predetermined distance from the positioning mark 121.

Subsequently, the position of a positioning axis 123 is identified. The positioning axis 123 represents a straight line that is perpendicular to the LD mounting end face 106 and that passes through the origin 122a. Lastly, the light-emitting element 130 is installed in the mounting part 120 in such a way that the central axis extending in the direction of radiation of light from the light-emitting element 130 is aligned with the positioning axis 123, and that the position of the light-emitting face 130a of the light-emitting element 130 (see FIG. 12) is aligned with the position of the LD mounting end face 106.

In this way, as a result of positioning the light-emitting element 130 using the positioning mark 121 that is provided around the mounting part 120, the positioning of the light-emitting element 130 in the mounting part 120 can be performed with a high degree of accuracy.

Figure 13B:
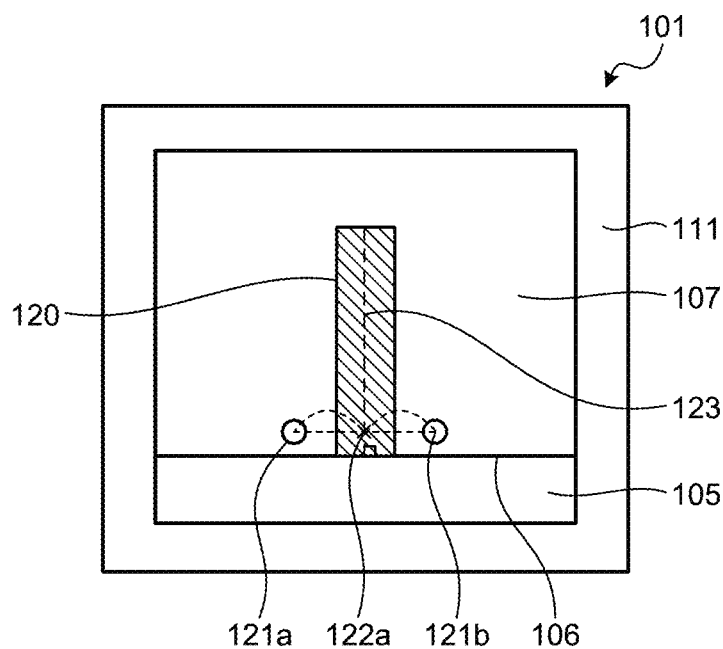
FIG. 13B is a plan view illustrating a second working example of arrangement of positioning marks provided in the substrate according to the sixth embodiment.

In FIGS. 13B to 13E are illustrated working examples where two positioning marks 121 are provided around the mounting part 120. In FIG. 13B is illustrated a working example where two positioning marks 121a and 121b are provided at positions sandwiching the mounting part 120. In the following explanation, in the case of distinguishing between two or more positioning marks 121; for example, the positioning marks 121 are referred to by reference numerals 121a, 121b, and so on.

In this working example, the midpoint of the positioning marks 121a and 121b is treated as the origin 122a. Then, in an identical manner to the working example illustrated in FIG. 13A, the positioning axis 123 is identified from the positions of the origin 122a and the LD mounting end face 106, and the light-emitting element 130 (see FIG. 12) is installed in the mounting part 120 in alignment with the positions of the positioning axis 123 and the LD mounting end face 106.

In the working example illustrated in FIG. 13B, the positioning marks 121a and 121b are provided at positions sandwiching the mounting part 120. That is, the mounting part 120 is formed in the center, and the two positioning marks 121 are provided on both sides of the mounting part 120. As a result, the light-emitting element 130 can be easily placed in the central portion of the substrate 101.

Moreover, as a result of providing the positioning marks 121a and 121b at positions sandwiching the mounting parts 120, the origin 122a in the mounting part 120 can be identified with a high degree of accuracy. As a result, the positioning of the light-emitting element 130 can be performed with a high degree of accuracy.

In FIG. 13B is illustrated the working example where the positioning marks 121a and 121b are provided to sandwich the LD mounting end face 106 side of the mounting part 120. However, the arrangement of the positioning marks 121a and 121b is not limited to that case. Alternatively, for example, as illustrated in FIG. 13C, the positioning marks 121a and 121b can be separated by some extent from the LD mounting end face 106 and arranged to sandwich the central portion of the mounting part 120.

In the working example illustrated in FIG. 13C too, in an identical manner to the working example illustrated in FIG. 13B, the midpoint of the positioning marks 121a and 121b is treated as the origin 122a, and the positioning axis 123 is identified from the positions of the origin 122a and the LD mounting end face 106. Then, the light-emitting element 130 (see FIG. 12) can be installed in the mounting part 120 in alignment with the positions of the positioning axis 123 and the LD mounting end face 106.

Figure 13C:
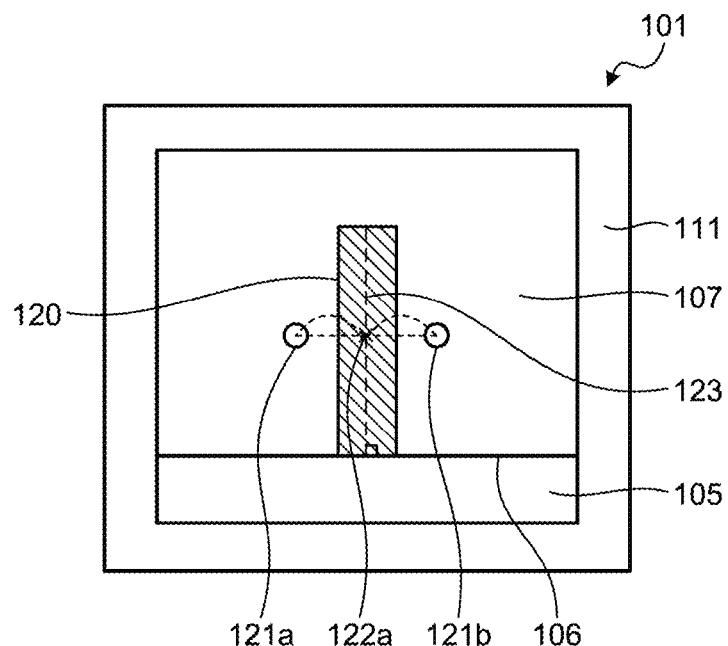
FIG. 13C is a plan view illustrating a third working example of arrangement of positioning marks provided in the substrate according to the sixth embodiment.

Meanwhile, the arrangement of the positioning marks 121a and 121b is not limited to sandwich the side of the mounting part 120 toward the LD mounting end face 106 (see FIG. 13B) or to sandwich the central portion of the mounting part 120 (see FIG. 13C). Alternatively, the positioning marks 121a and 121b can be arranged to sandwich that side of the mounting part 120 that is on the opposite side of the LD mounting end face 106.

Meanwhile, as illustrated in the working example in FIG. 13B, as a result of arranging the positioning marks 121a and 121b on the side where the light-emitting element 130 emits light (i.e., on the side toward the light-emitting face 130a of the light-emitting element 130 (see FIG. 12)), the origin 122a representing the reference for positioning can be set close to the light-emitting face 130a. As a result, the position of the light-emitting face 130a that is a critical factor in the positioning of the light-emitting element 130 can be determined with a higher degree of accuracy. Hence, the positioning of the light-emitting element 130 can be performed with a higher degree of accuracy.

Figure 13D:
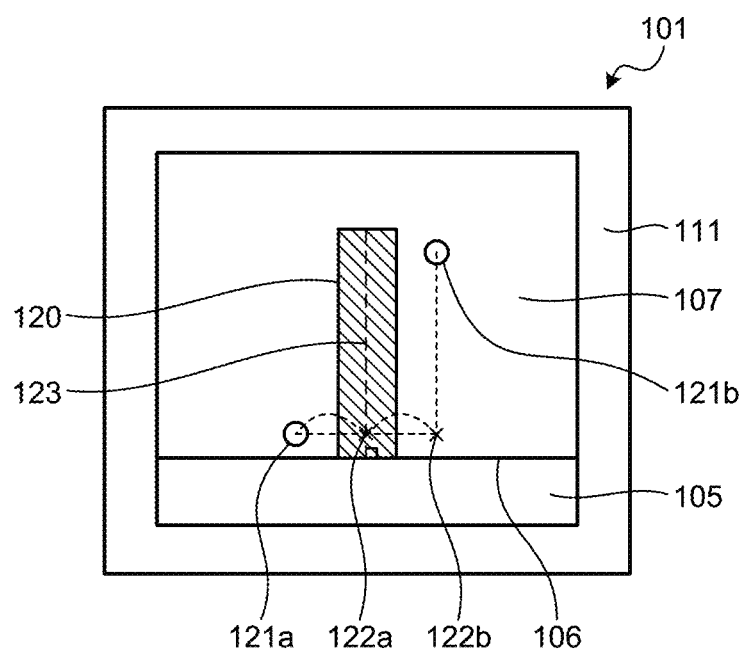
FIG. 13D is a plan view illustrating a fourth working example of arrangement of positioning marks provided in the substrate according to the sixth embodiment.

In FIG. 13D is illustrated a working example where the positioning mark 121a is provided on one side of the mounting part 120 and near the LD mounting end face 106, and the other positioning mark 121b is provided on the other side of the mounting part 120 and away from the LD mounting end face 106.

In this working example, the straight line that is parallel to the LD mounting end face 106 and that passes through the positioning mark 121a is identified; the straight line that is perpendicular to the LD mounting end face 106 and that passes through the positioning mark 121b is identified; and the point of intersection of the two straight lines is treated as an auxiliary point 122b.

Moreover, the midpoint of the auxiliary point 122b and the positioning mark 121a is treated as the origin 122a. Then, in an identical manner to the working example illustrated in FIG. 13A, the positioning axis 123 is identified from the positions of the origin 122a and the LD mounting end face 106, and the light-emitting element 130 (see FIG. 12) is installed in the mounting part 120 in alignment with the positions of the positioning axis 123 and the LD mounting end face 106.

Figure 13E:
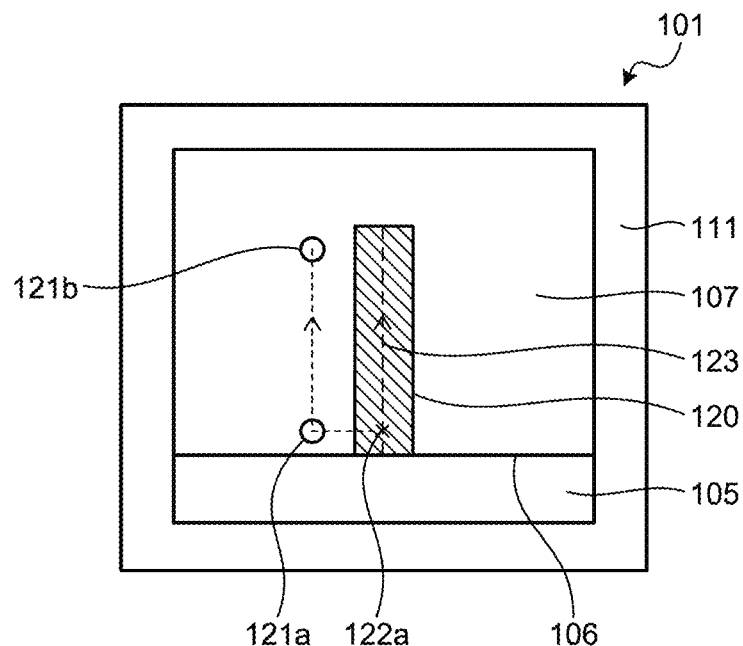
FIG. 13E is a plan view illustrating a fifth working example of arrangement of positioning marks provided in the substrate according to the sixth embodiment.

In each working example illustrated till now, the positioning axis 123 is identified to be perpendicular to the detected LD mounting end face 106. However, the positioning axis 123 need not always be perpendicular to the LD mounting end face 106. For example, as illustrated in FIG. 13E, the straight line that is parallel to the straight line joining the positioning marks 121a and 121b and that passes through the origin 122a can be treated as the positioning axis 123.

Moreover, in this working example, based on the position of the positioning mark 121a, the position of the origin 122a can be identified according to the identical method to the working example illustrated in FIG. 13A.

Moreover, in the working example illustrated in FIG. 13A, the positioning marks 121a and 121b can be arranged in such a way that the straight line joining them is parallel to one side of the substrate 101 that is rectangular in planar view. As a result, the positioning axis 123 can be set to be parallel to one side of the substrate 101. Hence, the direction of light emitted from the already-installed light-emitting element 130 (see FIG. 12) can be easily identified based on the concerned side of the substrate 101.

Figure 13F:
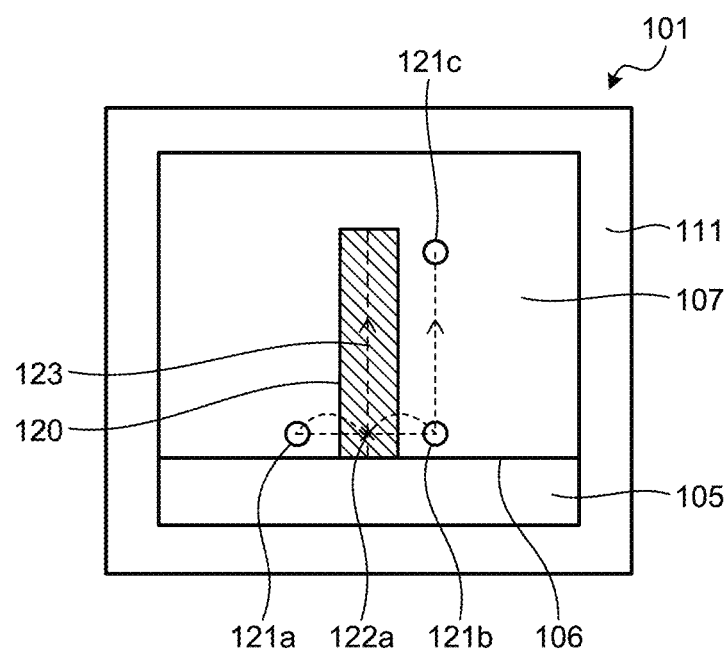
FIG. 13F is a plan view illustrating a sixth working example of arrangement of positioning marks provided in the substrate according to the sixth embodiment.
Figure 13G:
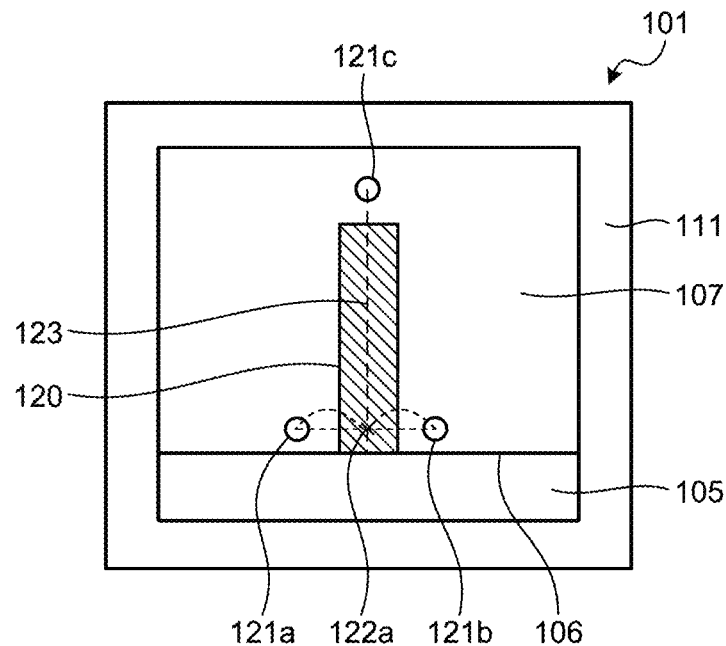
FIG. 13G is a plan view illustrating a seventh working example of arrangement of positioning marks provided in the substrate according to the sixth embodiment.

Illustrated in FIGS. 13F and 13G are working examples where three positioning marks 121 are provided around the mounting part 120. In FIG. 13F is illustrated a working example where the positioning mark 121a is provided on one side of the mounting part 120, and positioning marks 121b and 121c are provided on the other side of the mounting part 120.

In this working example, the midpoint of the positioning marks 121a and 121b is treated as the origin 122a. Moreover, the straight line that is parallel to the straight line joining the positioning marks 121b and 121c and that passes through the origin 122a is treated as the positioning axis 123. Then, in an identical manner to the working example illustrated in FIG. 13A, the light-emitting element 130 (see FIG. 12) is installed in the mounting part 120 in alignment with the positions of the positioning axis 123 and the LD mounting end face 106.

In the working example illustrated in FIG. 13F too, in an identical manner to the working example illustrated in FIG. 13E, the positioning marks 121b and 121c can be arranged in such a way that the straight line joining them is parallel to one side of the substrate 101 that is rectangular in planar view.

In FIG. 13G is illustrated a working example where the positioning marks 121a and 121b are provided to sandwich the LD mounting end face 106 side of the mounting part 120, and the positioning mark 121c is provided to face the end portion of the mounting part 120 on the opposite side of the LD mounting end face 106. In other words, in the state where the light-emitting element 130 is mounted (see FIG. 12), the positioning mark 121c is disposed on the opposite side to the side where the light-emitting element 130 emits light.

In this working example, the midpoint of the positioning marks 121a and 121b is treated as the origin 122a, and the straight line passing through the origin 122a and the positioning mark 121c is treated as the positioning axis 123. Then, in an identical manner to the working example illustrated in FIG. 13A, the light-emitting element 130 (see FIG. 12) is installed in the mounting part 120 in alignment with the positions of the positioning axis 123 and the LD mounting end face 106.

As illustrated in FIG. 13G, since at least one of a plurality of positioning marks 121 is provided on the opposite side to the side where the light-emitting element 130 emits light, the positioning axis 123 can be identified with a high degree of accuracy. Hence, the direction of light emitted by the already-installed light-emitting element 130 can be determined with a high degree of accuracy.

Moreover, as illustrated in FIG. 13G, it is preferable that the positioning axis 123 is identified directly from the positioning mark 121c and not from an auxiliary point. In other words, it is preferable that, in the state where the light-emitting element 130 is installed, the positioning mark 121c is provided on the central axis of the light-emitting element 130. As a result, the positioning axis 123 can be identified with a higher degree of accuracy, and thus the direction of light emitted from the already-installed light-emitting element 130 can be determined with a higher degree of accuracy.

Figure 13H:
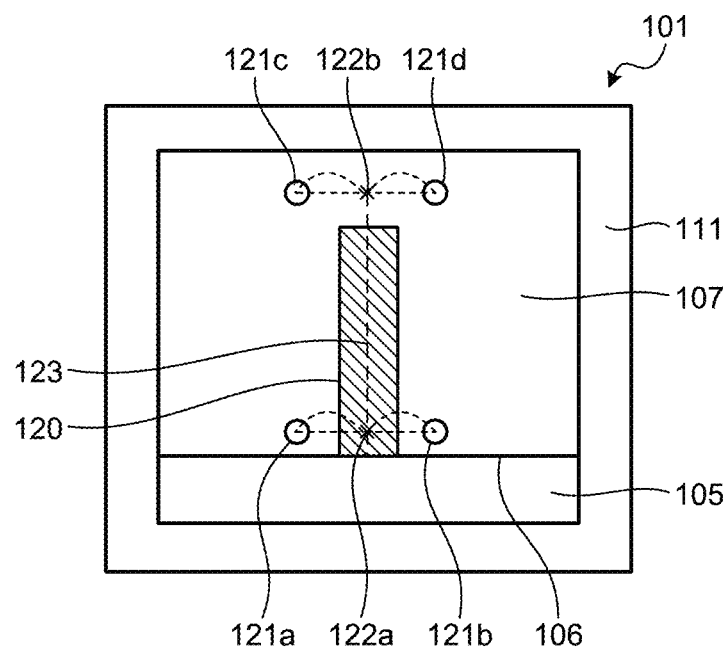
FIG. 13H is a plan view illustrating an eighth working example of arrangement of positioning marks provided in the substrate according to the sixth embodiment.

As the last working example, in FIG. 13H is illustrated a working example where four positioning marks 121 are provided around the mounting part 120. In FIG. 13H is illustrated a working example where the positioning marks 121a and 121b are provided to sandwich that side of the mounting part 120 that is on the side of the LD mounting end face 106, and positioning marks 121c and 121d are provided around the mounting part 120 on the opposite side of the LD mounting end face 106.

In this working example, the midpoint of the positioning marks 121a and 121b is treated as the origin 122a, and the midpoint of the positioning marks 121c and 121d is treated as the auxiliary point 122b. Moreover, the straight line passing through the origin 122a and the auxiliary point 122b is treated as the positioning axis 123. Then, in an identical manner to the working example illustrated in FIG. 13A, the light-emitting element 130 (see FIG. 12) is installed in the mounting part 120 in alignment with the positions of the positioning axis 123 and the LD mounting end face 106.

As illustrated in the working examples in FIGS. 13A to 13H, it is preferable that one to four positioning marks 121 are provided around the mounting part 120. Moreover, it is desirable that two to four positioning marks 121 are provided around the mounting part 120. As a result of provided two or more positioning marks 121 in the substrate 101, there is improvement in the accuracy of the positioning of the light-emitting element 130. On the other hand, if the number of positioning marks 121 provided in the substrate 101 is beyond necessity, it leads to an increase in the cost of the substrate 101.

Meanwhile, the arrangement of the positioning marks 121 is not limited to the working examples illustrated in FIGS. 13A to 13H. Alternatively, for example, two positioning marks 121 can be arranged in such a way that the straight line joining them is perpendicular to the direction of emission of light from the light-emitting element 130. As a result, the direction of light emitted from the already-installed light-emitting element 130 (see FIG. 12) can be easily identified based on the positions of the two positioning marks 121.

Moreover, in the working examples illustrated in FIGS. 13A to 13H, all positioning marks 121 are provided on the mounting face 107. However, the positioning marks 121 need not always be provided on the mounting face 107. For example, the positioning marks 121 can be provided on the bottom face 105 instead of the mounting face 107.

Meanwhile, it is desirable that the positioning marks 121 are protruding from or buried into the mounting face 107. As a result, the position of the mounting part 120 and the position of the positioning marks 121 can be simultaneously read by focusing a CCD camera on the mounting face 107, and thus the positioning of the light-emitting element 130 can be performed in a shorter period of time.

<Manufacturing Method According to Sixth Embodiment>

Explained below with reference to FIGS. 14 to 17 is a method for manufacturing the substrate 101 that constitutes the light-emitting element housing member A6 according to the sixth embodiment. FIGS. 14 to 17 are plan views when each process is viewed from above (only FIG. 16(*e*) is a plan view when viewed from below).

The substrate 101 is formed by performing predetermined processing on three green sheets; then performing press work by laminating the green sheets in a predetermined order; and lastly burning the laminated compact.

In the following explanation, the method of manufacturing an upper green sheet 140 is explained with reference to FIG. 14; the method of manufacturing a middle green sheet 150 is explained with reference to FIG. 15; and the method of manufacturing a lower green sheet 160 is explained with reference to FIG. 16. Lastly, the manufacturing process of the stage where the green sheets 140, 150, and 160 are combined is explained with reference to FIG. 17.

As illustrated in FIG. 14(*a*), the green sheet 140 that is processed in advance to have a predetermined shape is kept ready. Then, on the edge portion of the top face of the green sheet 140, a conductor pattern 141 is printed (see FIG. 14(*b*)). Lastly, the inside of the green sheet 140 is hollowed out and an opening 142 is formed in a rectangular shape in planar view (see FIG. 14(*c*)).

Figure 15:
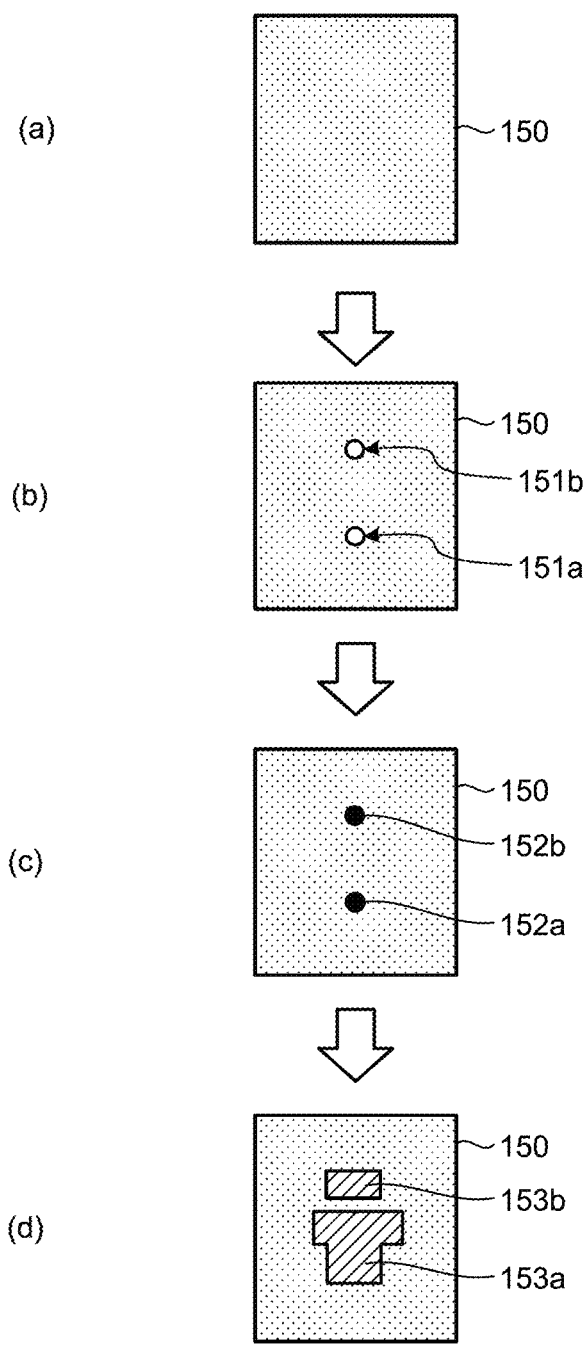
FIG. 15 is a plan view illustrating another manufacturing process of the light-emitting element housing member according to the sixth embodiment.

As illustrated in FIG. 15(*a*), the green sheet 150 that is processed in advance to have a predetermined shape is kept ready. Then, the inside of the green sheet 150 is hollowed out at two positions and holes 151*a* and 151*b* are formed that are circular in planar view (see FIG. 15(*b*)). Subsequently, the hole 151*a* is filled with a via conductor 152*a*, and the hole 151*b* is stored with a via conductor 152*b* (see FIG. 15(*c*)). Lastly, on the top face of the green sheet 150, a conductor pattern 153*a* is printed to become continuous with the via conductor 152*a*, and a conductor pattern 153*b* is printed to become continuous with the via conductor 152*b* (see FIG. 15(*d*)).

Figure 16:
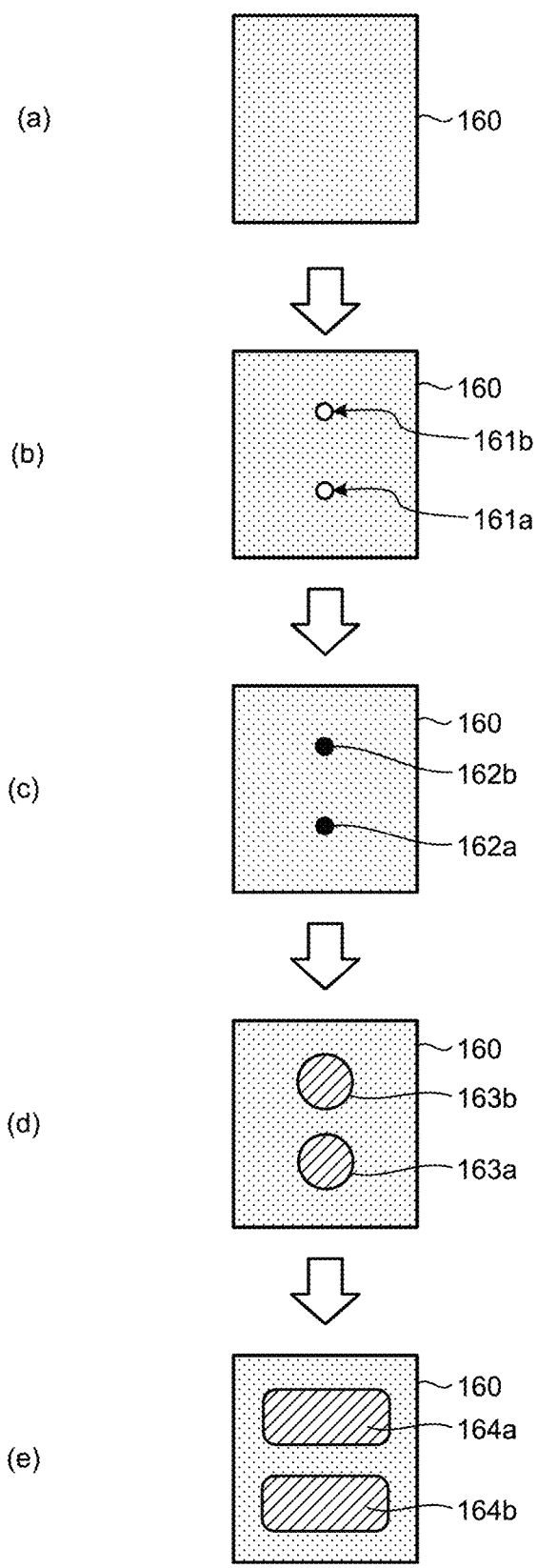
FIG. 16 is a plan view illustrating another manufacturing process of the light-emitting element housing member according to the sixth embodiment.

As illustrated in FIG. 16(*a*), the green sheet 160 that is processed in advance to have a predetermined shape is kept ready. Then, the inside of the green sheet 160 is hollowed out at two positions and holes 161*a* and 161*b* are formed that are circular in planar view (see FIG. 16(*b*)). The holes 161*a* and 161*b* are formed at the positions corresponding to the holes 151*a* and 151*b*, respectively, formed on the green sheet 150.

Then, the hole 161*a* is filled with a via conductor 162*a*, and the hole 161*b* is filled with a via conductor 162*b* (see FIG. 16(*c*)). Subsequently, on the top face of the green sheet 160, a conductor pattern 163*a* is formed to become continuous with the via conductor 162*a*, and a conductor pattern 163*b* is formed to become continuous with the via conductor 162*b* (see FIG. 16(*d*)). Lastly, on the bottom face of the green sheet 160, a conductor pattern 164*a* is printed to become continuous with the via conductor 162*a*, and a conductor pattern 164*b* is printed to become continuous with the via conductor 162*b* (see FIG. 16(*e*)).

Figure 17:
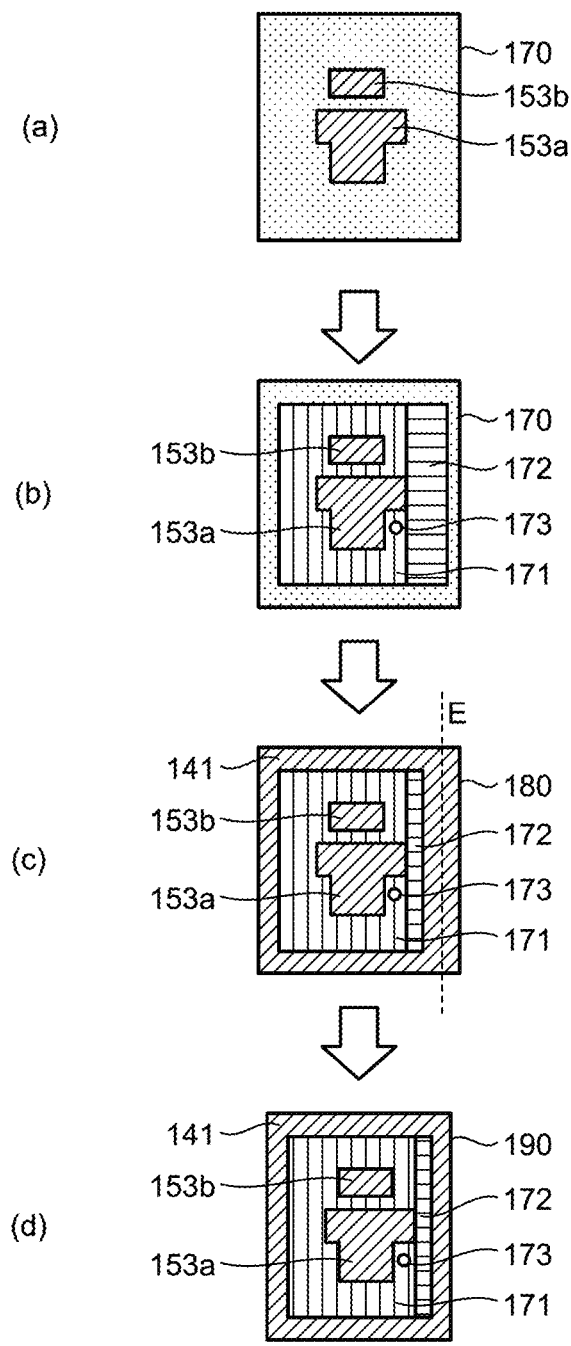
FIG. 17 is a plan view illustrating another manufacturing process of the light-emitting element housing member according to the sixth embodiment.

Then, the green sheets 150 and 160 that are processed in the manner described above, are laminated with the green sheet 150 placed on top and are subjected to heat and pressure so as to form a partial laminated body 170 (see FIG. 17(*a*)). Then, using a press mold having a predetermined shape, press work is performed downward from the upper side of the partial laminated body 170 so as to form a recess 171, a recess 172 having the bottom face at a lower level than the recess 171, and a salient 173 that protrudes from the bottom face of the recess 171 (see FIG. 17(*b*)).

The recess 171 is a region corresponding to the mounting face 107 of the substrate 101 (see FIG. 12); the recess 172 is a region corresponding to the bottom face 105 of the substrate 101 (see FIG. 12); and the salient 173 is a region corresponding to the positioning mark 121 of the substrate 101 (see FIG. 12).

Subsequently, on the top face of the partial laminated body 170 that has been subjected to press work, the green sheet 140 that has been processed as described earlier is laminated, and then pressure and temperature is applied so as to form a laminated body 180 (see FIG. 17(*c*)). Then, along a cut plane E present at a slightly inward position from the end face on the side of the recess 172, the laminated body 180 is cut in the vertical direction (see FIG. 17(*d*)). As a result of the cutting, an opening is formed that corresponds to the opening 104 of the substrate 101 (see FIG. 12). Lastly, a laminated compact 190 that is formed as illustrated in FIG. 17(*d*) is burnt at a high temperature (of about 1800° C.), and the substrate 101 reaches completion.

In the laminated compact 190, the conductor pattern 153*a* is a region corresponding to the first connection terminal 108 of the substrate 101 (see FIG. 12), and the conductor pattern 153*b* is a region corresponding to the second connection terminal 109 of the substrate 101 (see FIG. 12).

Moreover, in the laminated compact 190, the conductor pattern 153*a* is continuous with the conductor pattern 164*a* (see FIG. 16(*e*)) that is formed on the bottom face, via the via conductor 152*a* (see FIG. 15(*c*)), the conductor pattern 163*a* (see FIG. 16(*d*)), and the via conductor 162*a* (see FIG. 16(*c*)) in that order starting from the upper side. After the burning is performed, the conductor pattern 164a functions as a first external terminal (not illustrated) of the substrate 101 that is electrically connected to the first connection terminal 108.

Furthermore, in the laminated compact 190, the conductor pattern 153b is linked to the conductor pattern 164b (see FIG. 16(e)) that is formed on the bottom face, via the via conductor 152b (see FIG. 15(c)), the conductor pattern 163b (see FIG. 16(d)), and the via conductor 162b (see FIG. 16(c)) in that order starting from the upper side. After the burning is performed, the conductor pattern 164b functions as a second external terminal (not illustrated) of the substrate 101 that is electrically connected to the second connection terminal 109.

The green sheets 140, 150, and 160 have a fundamental configuration where an inorganic powder is formed when the powder of yttria ($Y_2O_3$), calcia (CaO), or erbia ($Er_2O_3$)) is mixed as a sintering agent in the powder of aluminum nitride representing the prime ingredient. Then, an organic binder, a fluxing material, and a solvent are added and mixed with the inorganic powder to form magma, and the magma is subjected to a known method such as the doctor blade method or the calendar roll method to from the green sheets 140, 150, and 160.

Meanwhile, the conductor patterns 141, 153a, 153b, 163a, 163b, 164a, and 164b as well as the via conductors 152a, 152b, 162a, and 162b are formed using, for example, a paste where aluminum nitride, an organic binder, and a solvent are mixed as co-agents with tungsten representing the prime ingredient.

Seventh Embodiment

Figure 18A:
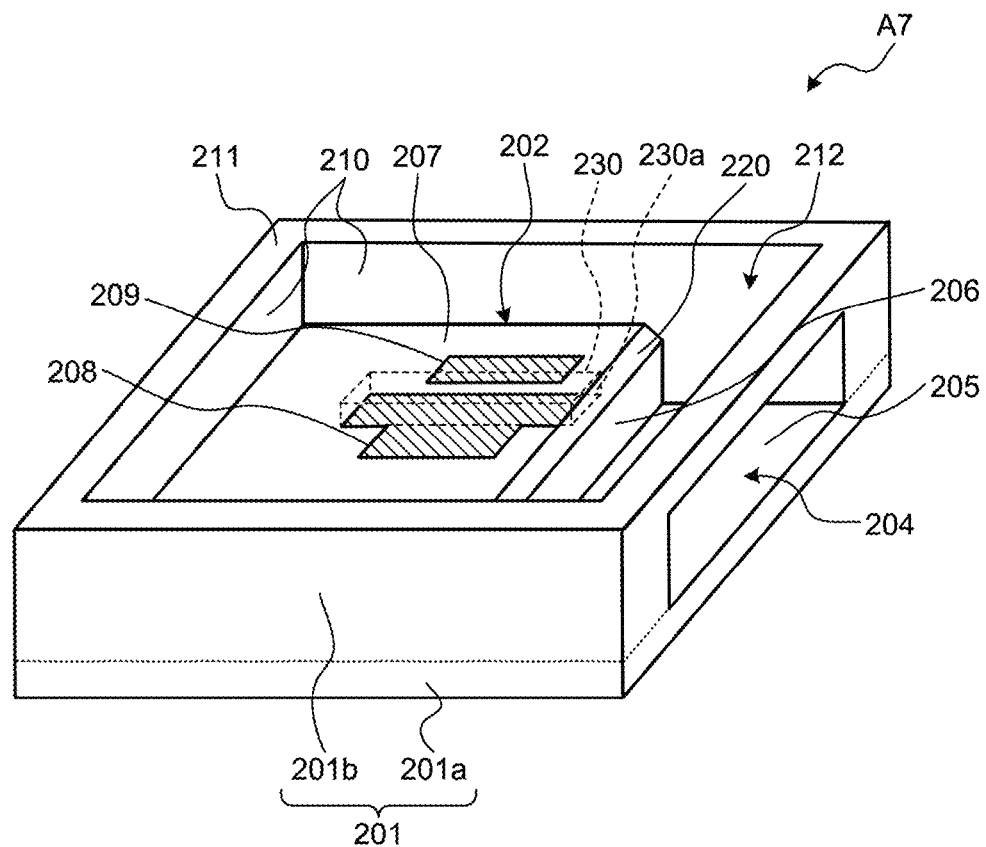
FIG. 18A is a perspective view of a light-emitting element housing member according to a seventh embodiment.
Figure 18B:
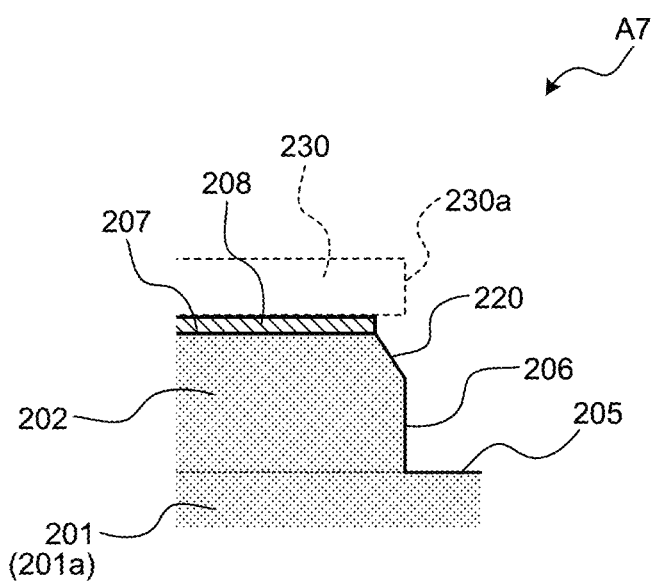
FIG. 18B is an enlarged cross-sectional view of the light-emitting element housing member according to the seventh embodiment.

Explained below with reference to FIGS. 18A and 18B is an overview of a light-emitting element housing member A7 according to a seventh embodiment.

The light-emitting element housing member A7 according to the seventh embodiment includes a substrate 201 and a mounting part 202. The substrate 201 is configured with a bottom base material 201a that has a rectangular shape in planar view, and a wall member 201b that is placed on the bottom base material 201a; and has a box-type structure that internally includes a space for enabling passage of the light emitted from a light-emitting element 230 illustrated using dashed lines.

The mounting part 202 has a level difference that protrudes upward from the bottom base material 201a of the substrate 201. The protruding face that protrudes from the bottom base material 201a represents a mounting face 207 where the light-emitting element 230 is mounted thereon, and a side face of the protruding portion represents an LD mounting end face 206.

The light-emitting element 230 is mounted in such a way that a light-emitting face 230a that is formed on one end face is adjacent to that edge of the mounting face 207 that faces an opening 204 and adjacent to the LD mounting end face 206. The light emitted from the light-emitting face 230a of the light-emitting element 230 is channelized to the outside via the internal space and the opening 204.

The light-emitting element housing member A7 according to the seventh embodiment includes a chamfered portion 220 at that edge of the mounting face 207 that is adjacent to the light-emitting face 230a. As illustrated in FIG. 18B, due to the chamfered portion 220, the portion of the mounting face 207 adjacent to the light-emitting face 230a is removed, and thus the emitted light is prevented from getting reflected from the mounting face 207. That enables achieving enhancement in the luminous efficiency of the light emitted to the outside from the light-emitting element housing member A7. The position where the chamfered portion 220 is formed represents the edge portion where the mounting face 207 and the LD mounting end face 206 that is facing the opening 204 intersect with each other.

Moreover, as a result of forming the chamfered portion 220, even if the positioning of the light-emitting face 230a is performed with reference to the LD mounting end face 206 (for example, if the positioning is done in such a way that the LD mounting end face 206 and the light-emitting face 230a are flush with each other), it becomes possible to hold down the reflection of light from the mounting face 207. Since the positioning of the light-emitting face 230a can be performed with reference to the LD mounting end face 206, it becomes possible to enhance the positioning accuracy of the light-emitting element 230 and to enhance the optical axis accuracy of the light channelized to the outside.

Given below with reference to FIGS. 18A and 18B is the explanation of the further detailed configuration of the light-emitting element housing member A7.

The substrate 201 and the mounting part 202 are formed using a ceramic. As far as the substrate 201 and the mounting part 202 are concerned, it is possible to use various types of ceramics. However, it is desirable that the ceramic includes aluminum nitride (AlN) as the major component because it has high thermal conductivity and has the coefficient of thermal expansion to be close to the light-emitting element 230.

If aluminum nitride of less than 80 mass percent is included in the substrate 201 and the mounting part 202, then there is a decline in the coefficient of thermal expansion of the substrate 201 and the mounting part 202, thereby possibly leading to diminished heat dissipation of the heat produced from the light-emitting element 230 to the outside.

Moreover, it is desirable that aluminum nitride of 90 mass percent or higher is included in the substrate 201 and the mounting part 202. As a result of having aluminum nitride of 90 mass percent or higher, the coefficient of thermal conductivity of the substrate 201 and the mounting part 202 can be set to 150 W/m or higher, and the light-emitting element housing member A7 having excellent heat dissipation capacity can be obtained.

It is preferable that the substrate 201 and the mounting part 202 are integrally formed using a ceramic. As a result of integrally forming the substrate 201 and the mounting part 202, there is no need to have a jointing member for joining the substrate 201 and the mounting part 202. As a result, the light-emitting element housing member A7 can be configured without a boundary face made of different materials and causing significant heat resistance.

Thus, the heat resistance between the substrate 201 and the mounting part 202 can be reduced, and the heat from the mounting part 202 can be transmitted in an efficient manner to the substrate 201. Hence, the light-emitting element housing member A7 having a high heat dissipation capacity can be obtained.

Moreover, as a result of integrally forming the substrate 201 and the mounting part 202, not only the process of joining the substrate 201 and the mounting part 202 becomes unnecessary but a jointing material such as solder also becomes unnecessary. As a result, it becomes possible to obtain the light-emitting element housing member A7 having low manufacturing cost. Meanwhile, the seventh embodiment is not limited to the case where the mounting part 202 is integrally formed with the substrate 201. Alternatively, the mounting part 202 can be configured as a separate member from the substrate 201.

The substrate 201 is configured with the bottom base material 201a and the wall member 201b as described above. The upper portion of the plate-type bottom base material 201a has the mounting part 202 disposed therein, and the wall member 201b is disposed to enclose three sides of the mounting part 202 in a U-shaped manner in planar view. Moreover, the opening 204 is formed to face the remaining one side of the mounting part 202.

A bottom face 205 that contacts the opening 204 and that is formed on the bottom base material 201a is substantially parallel to the mounting face 207 of the mounting part 202, and is formed at a lower level than the mounting face 207. Moreover, the bottom face 205 is formed in between the lower portion of the opening 204 and the lower portion of the LD mounting end face 206 that is a side face of the mounting part 202.

The LD mounting end face 206 that contacts the bottom face 205 is formed to be substantially parallel to that side face of the light-emitting element housing member A7 where the opening 204 is formed thereon. As described above, the LD mounting end face 206 can be used in the positioning of the light-emitting element 230.

On the mounting face 207 representing the top face of the mounting part 202, conductive layers 208 and 209 are formed. When the light-emitting element 230 is mounted on the mounting face 207, the conductive layer 208 gets electrically connected to a first electrode (not illustrated) that is disposed on the bottom face of the light-emitting element 230, using solder. Moreover, for example, the conductive layer 209 gets electrically connected to a second electrode (not illustrated) that is disposed on the top face of the light-emitting element 230, using a bonding wire (not illustrated).

That is, the conductive layers 208 and 209 function as connection terminals that are electrically connected to the first electrode and the second electrode, respectively, of the light-emitting element 230.

In the light-emitting element housing member A7, it is preferable that the conductive layer 208 is formed using at least one of a metallization layer and a plate layer. As a result of forming the conductive layer 208 using at least one of a metallization layer and a plate layer, the joining of the light-emitting element 230 using solder can be performed with more certainty.

In an identical manner, it is preferable that the conductive layer 209 too is formed using at least one of a metallization layer and a plate layer. With that, the conductive layers 208 and 209 can be simultaneously formed in the same process. As a result, it becomes possible to obtain the light-emitting element housing member A7 having low manufacturing cost.

In the light-emitting element housing member A7, the chamfered portion 220 is formed in between the mounting face 207 and the LD mounting end face 206. The chamfered portion 220 is formed by flatly chamfering the entire side positioned between the mounting face 207 and the LD mounting end face 206. With reference to FIGS. 18A and 18B, the explanation is given about an example where the chamfered portion 220 is flatly formed over the entire side. However, the chamfered portion 220 is not limited to have that configuration. Regarding other exemplary configurations of the chamfered portion 220, the explanation is given later.

As illustrated in FIG. 18B, it is preferable that the conductive layer 208 is formed at least up to the boundary portion between the mounting face 207 and the chamfered portion 220. As a result of forming the conductive layer 208 up to the boundary portion between the mounting face 207 and the chamfered portion 220, the light-emitting element 230 can be disposed as close to the opening 204 as possible. Hence, the light emitted from the light-emitting element 230 is channelized to the outside without the light colliding with the inner wall of the substrate 201 and the mounting part 202 and getting lost. Hence, it becomes possible to obtain the light-emitting element housing member A7 where the light channelized to the outside has high luminous efficiency.

Meanwhile, in the light-emitting element housing member A7, the conductive layer 208 is formed only on the mounting face 207 and is not formed on the chamfered portion 220.

Regarding the remaining part of the light-emitting element housing member A7, a cavity wall face 210 and a wall top face 211 are formed on the wall member 201b placed on the bottom base material 201a. The cavity wall face 210 represents a side on the inside of the wall member 201b, and the wall top face 211 represents the top face of the wall member 201b.

Moreover, in the light-emitting element housing member A7, a top-face opening 212 is formed on the top face side and is enclosed by the wall member 201b. As a result of forming the top-face opening 212, the light-emitting element 230 can be carried up to the mounting face 207 via the top-face opening 212.

Meanwhile, regarding the size of the light-emitting element housing member A7, the width and the length can be in the range of about 2 mm to 5 mm, and the height can be in the range of about 0.2 mm to 1 mm.

<Variations of Seventh Embodiment>

Explained below with reference to FIGS. 19A to 19G are variations of the light-emitting element housing member according to the seventh embodiment. FIGS. 19A to 19F are cross-sectional views corresponding to FIG. 18B explained earlier, and FIG. 19G is a perspective view corresponding to FIG. 18A explained earlier.

Figure 19A:
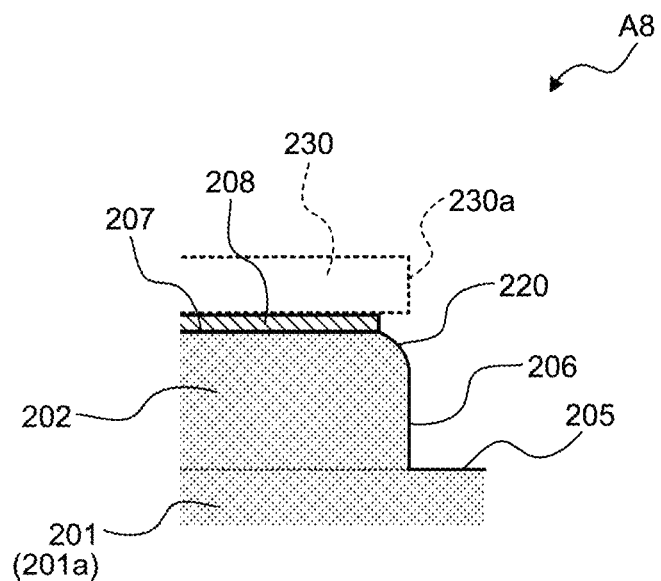
FIG. 19A is an enlarged cross-sectional view of the light-emitting element housing member according to a first variation of the seventh embodiment.

FIG. 19A is an enlarged cross-sectional view of a light-emitting element housing member A8 according to a first variation. In the light-emitting element housing member A8, the chamfered portion 220 is formed not in a planar shape but in a curved shape. In other words, what is called rounding is performed on that edge of the mounting face 207 that is adjacent to the light-emitting face 230a of the light-emitting element 230.

As a result, the heat produced in the light-emitting element 230 can be prevented from getting accumulated in the mounting part 202. That is because, although the heat gets easily accumulated at corners, by forming the chamfered portion 220 in a curved shape in the light-emitting element housing member A8, the corners of the mounting part 202 are made smaller. Hence, as a result of forming the chamfered portion 220 in a curved shape, it becomes possible to obtain the light-emitting element housing member A8 having an enhanced heat dissipation capacity.

Figure 19B:
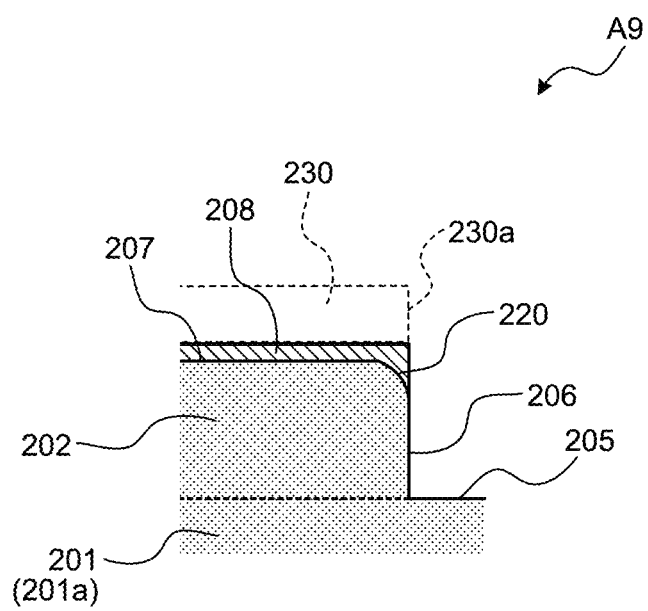
FIG. 19B is an enlarged cross-sectional view of the light-emitting element housing member according to a second variation of the seventh embodiment.

A light-emitting element housing member A9 illustrated in FIG. 19B differs from the light-emitting element housing member A8 in the way that the conductive layer 208 is formed from the mounting face 207 up to the chamfered portion 220.

As a result of forming the conductive layer 208 in this manner, if a metallization layer as well as a plate layer is used as the conductive layer 208, it becomes possible to form the plate layer with a uniform thickness. That is because, if electrolytic plating is performed on the metallization layer formed on the chamfered portion 220 having a curved shape, it becomes possible to avoid local concentration of electrical field as prone to occur at corners. As a result, the flatness of the mounting face 207 can be enhanced, and thus the light-emitting element 230 can be mounted on the mounting face 207 without inclination. Hence, it becomes possible to hold down the axial runout of the optical axis of the light emitted from the light-emitting element 230 to the outside.

Figure 19C:
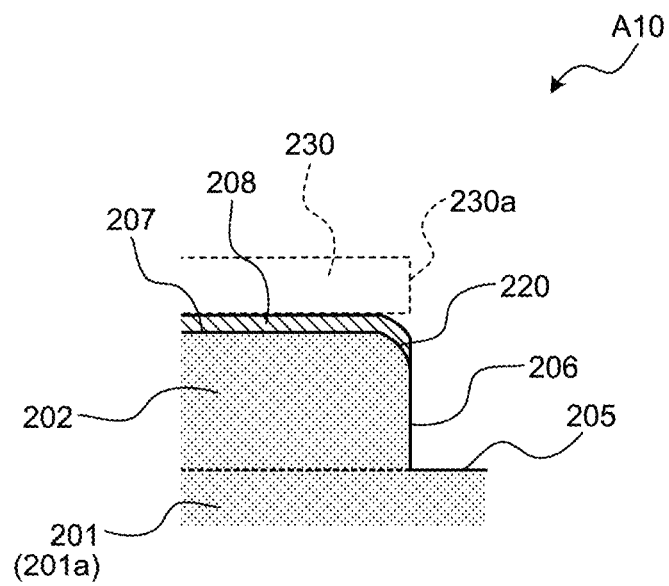
FIG. 19C is an enlarged cross-sectional view of the light-emitting element housing member according to a third variation of the seventh embodiment.

A light-emitting element housing member A10 illustrated in FIG. 19C differs from the light-emitting element housing member A9 in the way that the conductive layer 208 that is formed from the mounting face 207 up to the chamfered portion 220 has the same thickness from the mounting face 207 to the chamfered portion 220.

As a result of forming the conductive layer 208 in this manner, at the time of joining the light-emitting element 230 onto the conductive layer 208, meniscus can be formed in between the light-emitting element 230 and the conductive layer 208. Hence, it becomes possible to enhance the mounting reliability of the light-emitting element 230. Meanwhile, herein, the "same thickness" implies that the difference in thicknesses is within 0.01 μm.

Figure 19D:
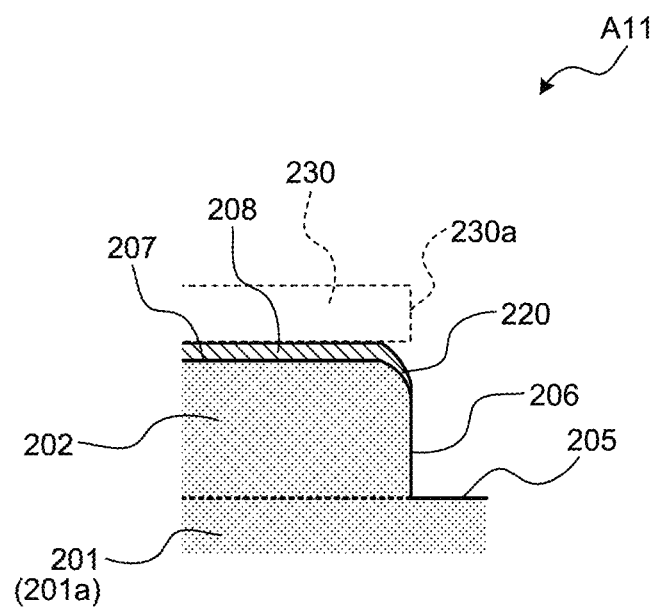
FIG. 19D is an enlarged cross-sectional view of the light-emitting element housing member according to a fourth variation of the seventh embodiment.
Figure 19E:
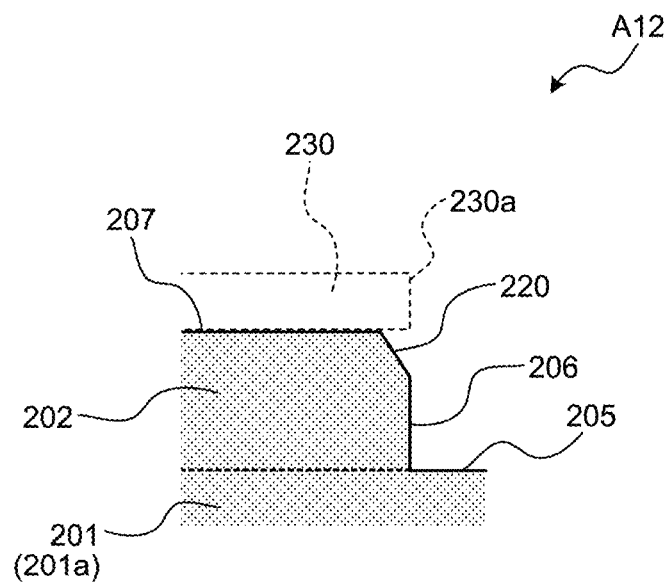
FIG. 19E is an enlarged cross-sectional view of the light-emitting element housing member according to a fifth variation of the seventh embodiment.
Figure 19F:
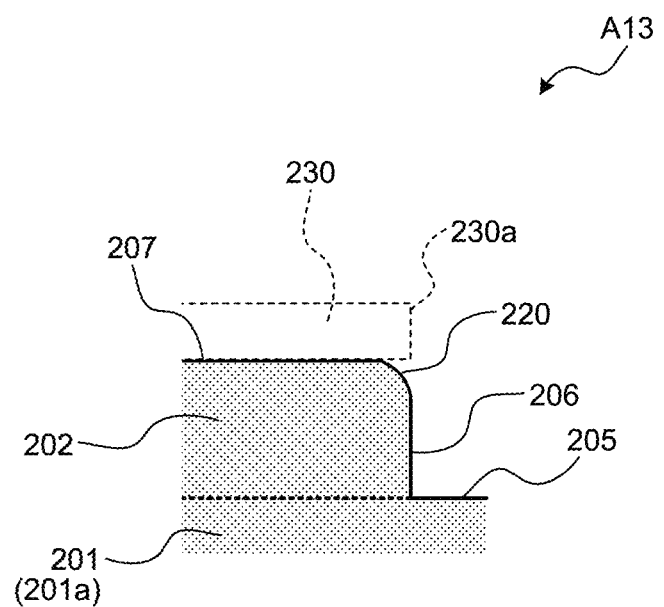
FIG. 19F is an enlarged cross-sectional view of the light-emitting element housing member according to a sixth variation of the seventh embodiment.
Figure 19G:
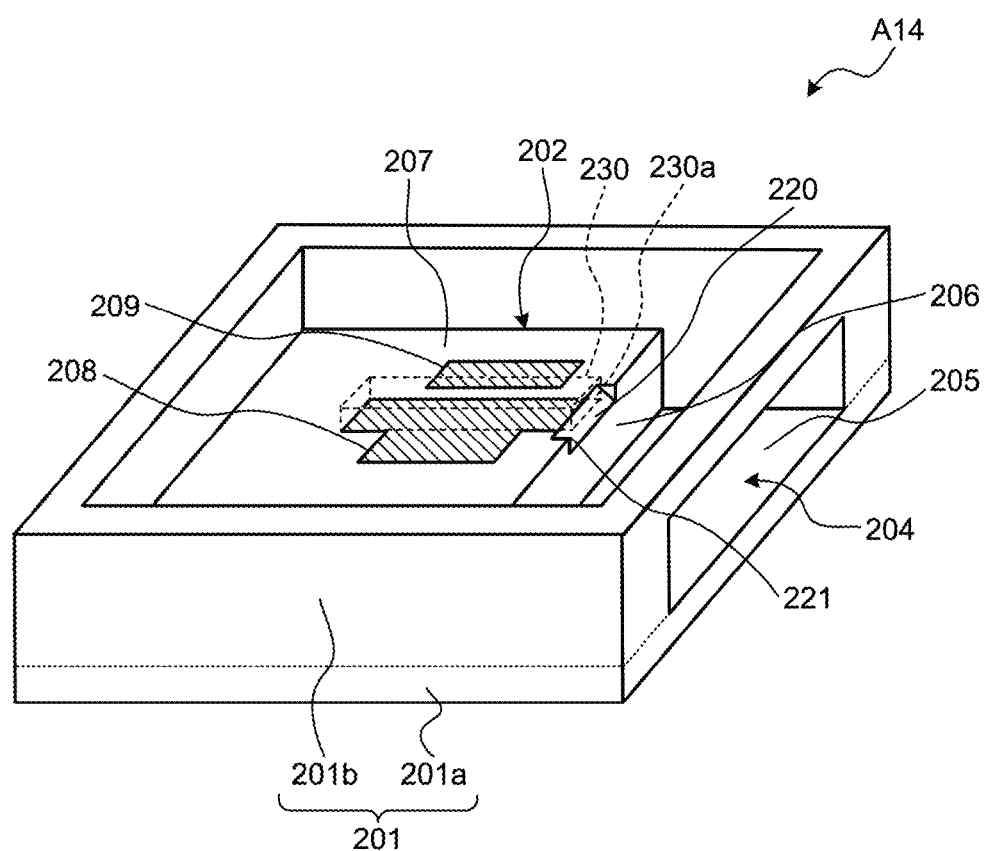
FIG. 19G is an enlarged cross-sectional view of the light-emitting element housing member according to a seventh variation of the seventh embodiment.

A light-emitting element housing member A11 illustrated in FIG. 19D differs from the light-emitting element housing member A10 in the way that the conductive layer 208 that is formed from the mounting face 207 up to the chamfered portion 220 gradually becomes thinner from the mounting face 207 toward the chamfered portion 220.

As a result of forming the conductive layer 208 in this manner, cracks can be prevented from developing in the conductive layer 208 on the side of the chamfered portion 220, because of the following reason. There is a large difference in the coefficients of thermal expansion of the metallic conductive layer 208 and the ceramic mounting part 202. Hence, if the conductive layer 208 is thick; then there are times when, in the end portion of the conductive layer 208 on the side of the chamfered portion 220, cracks develop on the side of the mounting part 202. However, if the conductive layer 208 on the side of the chamfered portion 220 that is prone to developing cracks is reduced in thickness, it results in a structure that enables alleviation of the difference in the coefficients of thermal expansion.

Hence, by gradually reducing the thickness of the conductive layer 208 from the mounting face 207 toward the chamfered portion 220, it becomes possible to obtain the light-emitting element housing member A11 having a high degree of reliability.

Till now, the explanation was given for a case where the conductive layer 208 is formed on the mounting face 207. However, in the seventh embodiment, the conductive layer 208 need not always be formed on the mounting face 207. For example, as in the case of light-emitting elements A12 and A13 illustrated in FIGS. 19E and 19F, respectively; the conductive layer 208 (see FIG. 18A) may not be formed on the mounting face 207 of the mounting part 202, and the light-emitting element 230 can be directly disposed in the mounting part 202.

In this case too, by forming the chamfered portion 220 in a planar shape (FIG. 19E) or the chamfered portion 220 in a curved shape (FIG. 19F) at the edge of the mounting face 207, the light emitted from the light-emitting face 230a of the light-emitting element 230 can be prevented from getting reflected from the mounting face 207. Hence, it becomes possible to enhance the luminous efficiency of the light channelized to the outside. Moreover, in the light-emitting element housing member A13 illustrated in FIG. 19F, by forming the chamfered portion 220 in a curved shape, the heat dissipation capacity can be enhanced.

In the light-emitting element housing members A12 and A13, there is no need to use a conductive jointing material such as solder for joining the mounting face 207 and the light-emitting element 230, and an insulating adhesive agent can be used.

Till now, the explanation was given for the case where the chamfered portion 220 is formed over the entire side present between the mounting face 207 and the LD mounting end face 206. However, in the seventh embodiment, the chamfered portion 220 need not be formed over the entire side. For example, as in the case of a light-emitting element housing member A14 illustrated in FIG. 19G, the chamfered portion 220 can be formed only in the area where the edges of the light-emitting element 230 and the mounting face 207 are adjacent to each other. In that case too, since the chamfered portion 220 is formed in the vicinity of the light-emitting face 230a, it becomes possible to enhance the luminous efficiency of the light channelized to the outside. Moreover, a corner 221 that is formed at a side edge of the chamfered portion 220 is used as the positioning mark for the light-emitting element 230. With that, the positioning accuracy of the light-emitting element 230 can be enhanced, and in turn the optical axis accuracy of the emitted light can be enhanced.

Meanwhile, the shape and the arrangement of the chamfered portion 220 and the conductive layer 208 are not limited to the working examples described above. For example, the chamfered portion 220 is not limited to have a planar shape or a curved shape, and can have a multifaceted shape. Thus, as long as the chamfering is done to ensure that the light emitted from the light-emitting face 230a does not get reflected, the chamfered portion 220 can have any shape.

<Manufacturing Method According to Seventh Embodiment>

Figure 20:
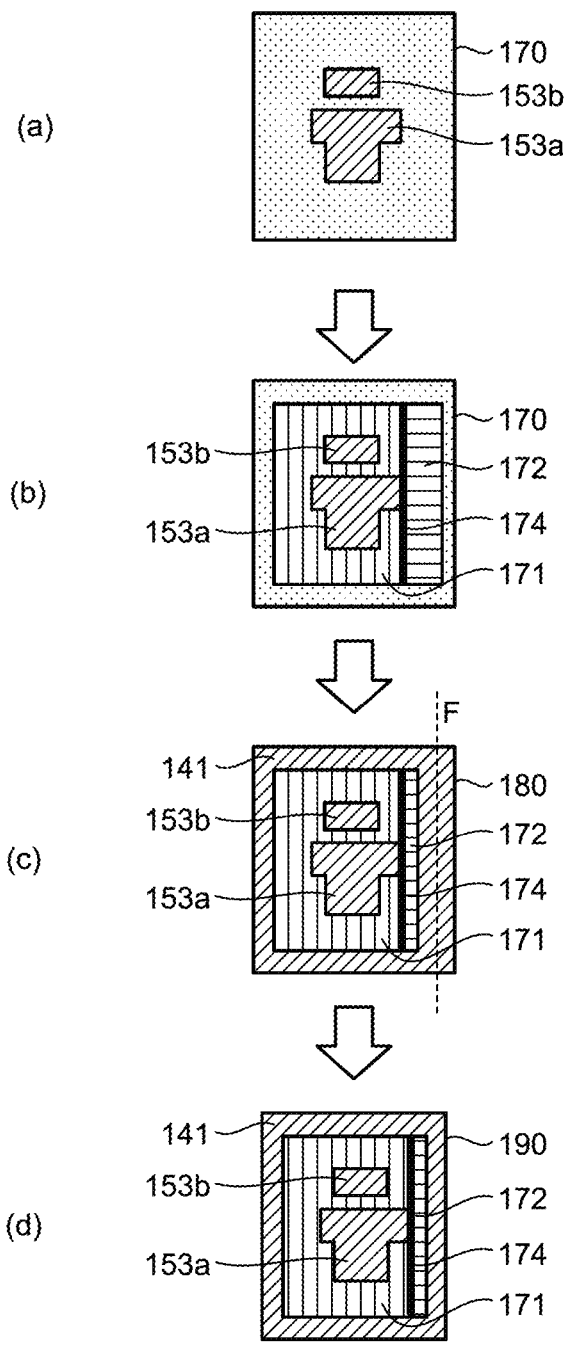
FIG. 20 is a plan view illustrating another manufacturing process of the light-emitting element housing member according to the seventh embodiment.

Explained with reference to FIG. 20 is a method for manufacturing the light-emitting element housing member A7 according to the seventh embodiment. FIG. 20 is a plan view of each process when viewed from above.

The light-emitting element housing member A7 is formed by performing predetermined processing on three green sheets; then laminating the green sheets in a predetermined order and performing press work; and lastly burning the laminated compact.

In the manufacturing process for manufacturing the light-emitting element housing member A7 according to the seventh embodiment, the manufacturing process for manufacturing the green sheets 140, 150, and 160 is identical to the manufacturing process illustrated in FIGS. 14 to 16 according to the sixth embodiment. Hence, that explanation is not repeated.

Subsequently, the green sheets 150 and 160 that are processed as illustrated in FIGS. 14 to 16 are laminated with the green sheet 150 placed on top and are subjected to heat and pressure so as to form the partial laminated body 170 (see FIG. 20(a)). Then, using a press mold having a predetermined shape, press work is performed downward from the upper side of the partial laminated body 170 so as to form the recess 171, the recess 172 having the bottom face at a lower level than the recess 171, and an inclined portion 174 that is inclined toward the recess 172 from the edge of the bottom face of the recess 171 (see FIG. 20(b)).

The recess 171 is a region corresponding to the mounting face 207 of the light-emitting element housing member A7 (see FIG. 18A), and the recess 172 is a region corresponding to the bottom face 205 of the light-emitting element housing member A7 (see FIG. 18A). The inclined portion 174 is a region corresponding to the chamfered portion 220 of the light-emitting element housing member A7 (see FIG. 18A). Herein, by varying the shape of the press mold, the shape of the chamfered portion 220 can be suitably varied.

Subsequently, on the top face of the partial laminated body 170 that has been subjected to press work, the green sheet 140 that has been processed as described earlier is laminated, and then pressure and temperature is applied so as to form the laminated body 180 (see FIG. 20(c)). Then, along a cut plane F present at a slightly inward position from the end face on the side of the recess 172, the laminated body 180 is cut in the vertical direction (see FIG. 20(d)). As a result of the cutting, an opening is formed that corresponds to the opening 204 of the light-emitting element housing member A7 (see FIG. 18A). Lastly, the laminated compact 190 that is formed as illustrated in FIG. 20(d) is burnt at a high temperature (of about 1800° C.), and the light-emitting element housing member A7 reaches completion.

Meanwhile, regarding the connection status of the conductor patterns 141, 153a, 153b, 163a, 163b, 164a, and 164b as well as regarding the connection status of the via conductors 152a, 152b, 162a, and 162b, and regarding the constituent members of the green sheets 140, 150, and 160; the explanation is identical to the explanation given in the sixth embodiment.

WORKING EXAMPLES

Working Example of Fourth Embodiment

The following explanation is given about concretely manufacturing a light-emitting element housing board where the substrate for the light-emitting element housing member A4 as illustrated in FIGS. 5A and 5B according to the fourth embodiment served as the fundamental configuration; and then manufacturing the light-emitting device illustrated in FIGS. 6A and 6B where the light-emitting element housing board according to the fourth embodiment was adapted.

Firstly, as the mixed powder for forming the green sheets, a mixed powder is prepared by mixing 94 mass percent of aluminum nitride powder with 5 mass percent of $Y_2O_3$ powder and 1 mass percent of CaO powder.

Then, with respect to 100 parts of the mixed powder (solid content), 20 parts of an acrylic binder representing an organic binder and 50 parts of toluene were added to prepare a slurry; and then the doctor blade method was implemented to prepare green sheets having the average thickness of 260 μm.

Moreover, during the formation of conductors, a conductive paste was used where 20 parts by weight of aluminum nitride powder, 8 parts by weight of an acrylic binder, and terpineol were appropriately added to 100 parts by weight of tungsten (W) powder.

In the manufactured green sheets, through holes that would later represent via hole conductors and space portions were formed at predetermined positions using NC punching.

Subsequently, on the green sheets having through holes formed thereon, the conductive paste was filled using screen printing; conductor patterns representing the internal wiring pattern and the surface layer wiring pattern were formed; and the conductor patterns were processed so as to obtain pattern sheets illustrated in FIG. 21A to 21E. In FIGS. 21A to 21E are illustrated pattern sheets that are sequentially laminated from the lower layer side to the upper layer side of the laminated compact. In FIGS. 21A to 21F, the green sheet is referred to by a reference numeral 40, the conductor (via hole conductor) is referred to by a reference numeral 41, the conductor (internal wiring pattern) is referred to by a reference numeral 42, the conductor (surface layer wiring pattern) is referred to by a reference numeral 43, the conductor (seal ring connection pattern) is referred to by a reference numeral 44, the conductor (electrode terminal) is referred to by a reference numeral 45, and the through hole is referred to by a reference numeral 46.

Figure 21A:
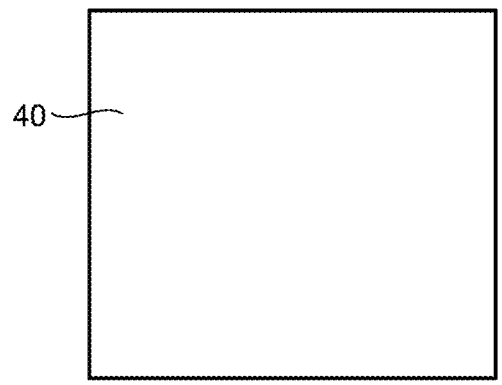
FIG. 21A is a schematic plan view of a pattern sheet (1) used in manufacturing the light-emitting element housing board according to the fourth embodiment.
Figure 21B:
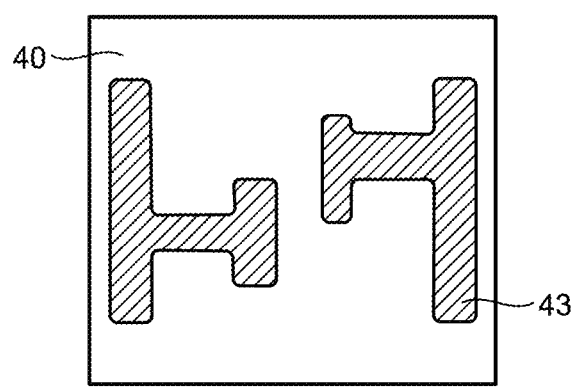
FIG. 21B is a schematic plan view of a pattern sheet (2) used in manufacturing the light-emitting element housing board according to the fourth embodiment.
Figure 21C:
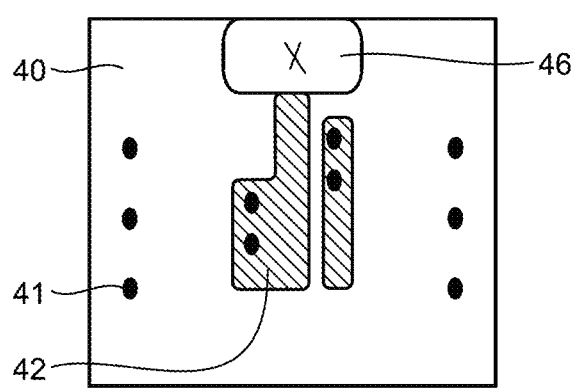
FIG. 21C is a schematic plan view of a pattern sheet (3) used in manufacturing the light-emitting element housing board according to the fourth embodiment.
Figure 21D:
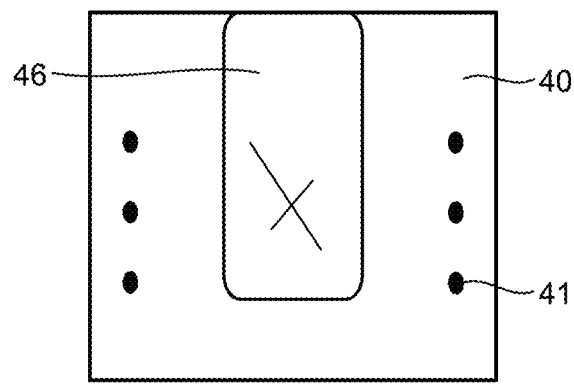
FIG. 21D is a schematic plan view of a pattern sheet (4) used in manufacturing the light-emitting element housing board according to the fourth embodiment.
Figure 21E:
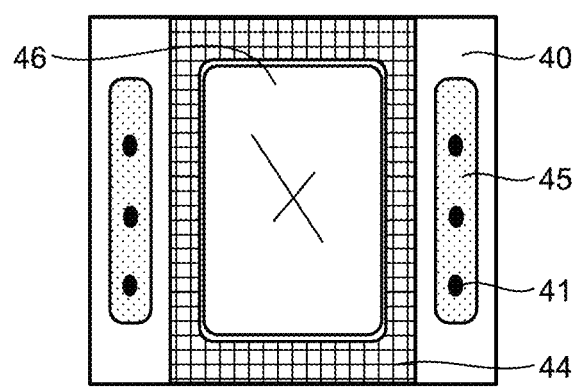
FIG. 21E is a schematic plan view of a pattern sheet (5) used in manufacturing the light-emitting element housing board according to the fourth embodiment.
Figure 21F:
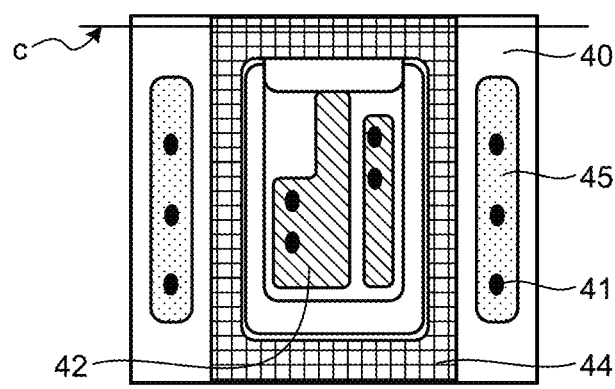
FIG. 21F is a schematic plan view of a laminated body formed from a plurality of pattern sheets used in manufacturing the light-emitting element housing board according to the fourth embodiment.

Of the drawings, the hollowed-out portion that is formed in the pattern sheet illustrated in FIG. 21E represents a through hole for forming a space portion in the substrate. FIG. 21F is a plan view of a laminated body that is formed by laminating the pattern sheets illustrated in FIGS. 21A to 21E, when viewed from the side of the pattern sheet illustrated in FIG. 21E.

Subsequently, the pattern sheets were sequentially laminated from the lower side, and pressure and heat was applied to manufacture a laminated compact. Meanwhile, in FIGS. 21A to 21E, only the pattern sheets for manufacturing a single laminated compact is illustrated. However, even if a method is implemented where multiple pattern sheets including a plurality of pattern sheets arranged in a matrix are manufactured and layered before cutting individual sheets; it is still possible to manufacture a laminated compact having an identical structure.

Subsequently, in a reducing atmosphere, the laminated compact was burnt for two hours with the maximum temperature of 1800° C. Regarding the size of the light-emitting element housing member A4 that was manufactured, the post-burning shape was (2.5 mm in width)×(4.2 mm in length)×(1.08 mm in thickness).

Then, the post-burning light-emitting element housing board was subjected to dicing along a cutting line c illustrated in FIG. 21F, and an opening of (1.44 mm)×(0.43 mm) was formed at an end face of the substrate. Moreover, in the pattern sheet illustrated in FIG. 21E, the hollowed-out portion and the opening became continuous, and it was possible to form a space portion (in planar view, the area of (1.8 mm)×(1.8 mm)) along with an opening in the substrate.

Subsequently, in the post-burning light-emitting element housing board, on the exposed conductor formed on the top face and provided for seal ring connection, an Ni plated film having a thickness of approximately 5 μm was formed. Then, to the Ni plated film, a Kovar seal ring (having thickness of 0.1 mm) was joined using Ag—Cu wax.

Subsequently, using a low-melting-point glass paste, a glass plate was glued around the opening (opening area: (1.4 mm)×(0.43 mm)) formed at an end face of the substrate, and the opening was covered. Herein, a glass plate having an antireflection coating layer was used.

Subsequently, a light-emitting device was manufactured by gluing a light-emitting element to the mounting part of the light-emitting element housing board using Au—Sn solder, and by joining a Kovar lid on the seal ring according to the seam welding method. As the light-emitting element, a laser diode in the range of 1.5 kW was used that had the same size as the laser diode used in a CAN package type of ϕ9 mm (length of 10 mm). Moreover, a test piece was also manufactured in an identical manner by applying, to the lid, a sintered compact of aluminum nitride that is the same material as the substrate.

In the light-emitting device manufactured in this way, the light-emitting element housing board had the size (in this case, the size of the outer shape) of (2.5 mm)×(4.2 mm)×(1.33 mm) (volume: 13.97 mm$^3$). As a result, even if a laser diode having the same size is used, as compared to the volume (635 mm³) of the CAN package type, the apparent area in planar view could be lowered by 83.5%, and the apparent volume in planar view could be lowered by 97.8%.

The light-emitting device manufactured in this way was then combined with a heatsink member in the same way as in the case of the CAN package type. As a result, it was possible to obtain a light-emitting device where the fluctuation range of the emission intensity remains within 3% over a long period of time.

<Working Example of Sixth Embodiment>

The following explanation is given about concretely manufacturing the light-emitting element housing member A6 according to the sixth embodiment where the substrate 101 illustrated in FIG. 12 and FIGS. 13A to 13H served as the fundamental configuration; and then manufacturing a light-emitting device where the light-emitting element housing member A6 was adapted.

Firstly, as the mixed powder for forming the green sheets, a mixed powder is prepared by mixing 94 mass percent of aluminum nitride powder with 5 mass percent of yttria powder and 1 mass percent of calcia powder.

Then, with respect to 100 parts of the mixed powder (solid content), 20 parts of an acrylic binder representing an organic binder and 50 parts of toluene were added to prepare a slurry; and then the doctor blade method was implemented to prepare green sheets having the average thickness of 500 µm.

Moreover, during the formation of conductors such as conductor patterns and via conductors, a conductive paste was used where 20 parts by mass of aluminum nitride powder, 8 parts by mass of an acrylic binder, and terpineol were appropriately added to 100 parts by mass of tungsten powder.

Using the green sheets and the conductors having the composition as described above, the laminated compact 190 (see FIG. 17(d)) was manufactured according to the manufacturing method illustrated in FIGS. 14 to 17.

Subsequently, in a reducing atmosphere, the laminated compact 190 was burnt for two hours with the maximum temperature of 1800° C., and the substrate 101 was manufactured. Regarding the size of the manufactured substrate 101, the post-burning shape was (2.5 mm in width)×(4.2 mm in length)×(1.08 mm in thickness).

Subsequently, on the conductor pattern 141 (see FIG. 17(d)) formed on the wall top face 111 of the substrate 101 (see FIG. 12), an Ni plated film having a thickness of approximately 5 µm was formed. Then, to the Ni plated film, a Kovar seal ring (having thickness of 0.1 mm) was joined using Ag—Cu wax.

Subsequently, using a low-melting-point glass paste, a glass plate ((1.7 mm in width)×(0.8 mm in height)) was glued around the opening 104 (see FIG. 12) ((1.4 mm in width)×(0.43 mm in height)) formed on the substrate 101, and the opening 104 was covered. Herein, a glass plate having an antireflection coating layer was used.

Subsequently, according to the positioning methods illustrated in FIGS. 13A to 13H, the light-emitting element 130 was installed in the mounting part 120 of the substrate 101, and the light-emitting element housing member A6 was obtained. Herein, as the light-emitting element 130, a semiconductor laser element having the oscillation wavelength of 462 nm ((0.3 mm in width)×(1.2 mm in length)×(0.15 mm in height)) was used. Moreover, Au—Sn solder was used for joining the light-emitting element 130 to the mounting part 120.

Subsequently, using an evaluation device illustrated in FIG. 22, the positioning accuracy of the light-emitting element 130 inside the light-emitting element housing member A6 (see FIG. 12) was evaluated. More particularly, the light-emitting element housing member A6 was installed in a printed-wiring assembly 300, and the positioning accuracy was evaluated based on an emitted light 302 that was emitted from a light source onto a plane 301 present at a distance of 50 mm.

Figure 22:
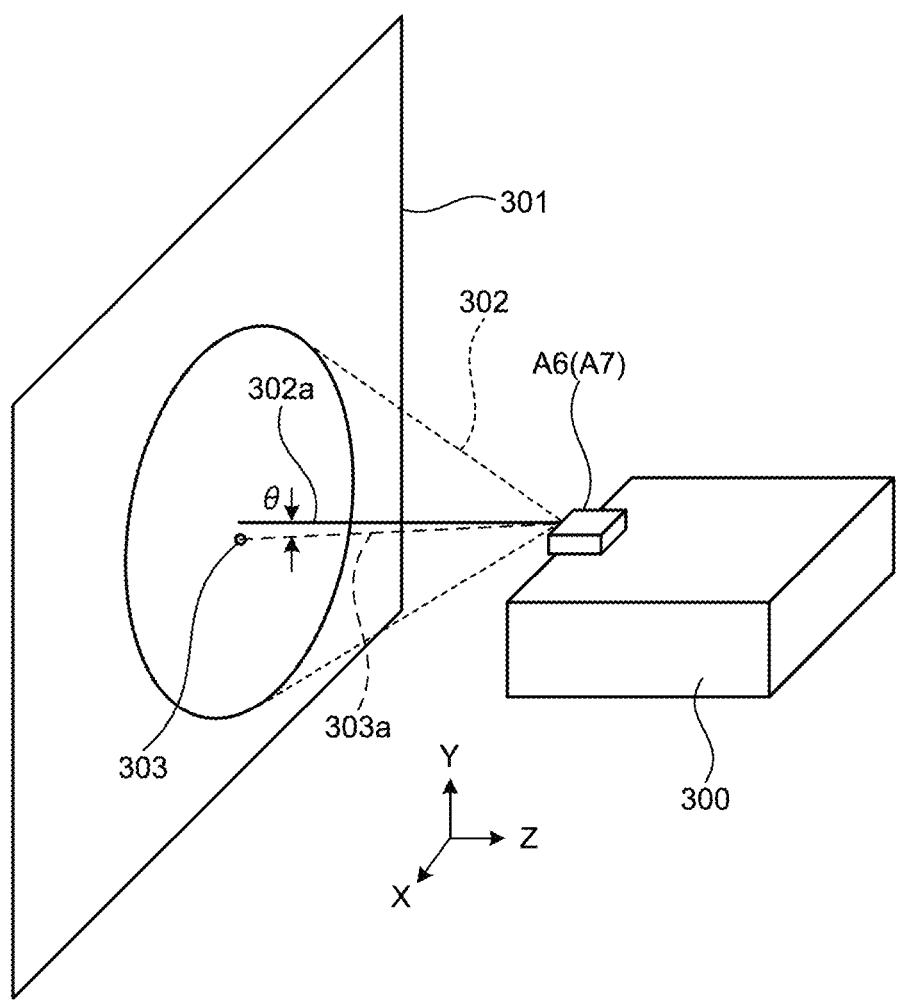
FIG. 22 is a conceptual diagram illustrating an evaluation device for positioning accuracy of a light-emitting element in the light-emitting element housing members according to the sixth and seventh embodiments.

Herein, with respect to each structure, the number of test pieces was set to n=20, and the standard deviation of the position of the emitted light 302 was obtained in each of X, Y, and Z directions illustrated in FIG. 22. Moreover, with respect to a straight line 303a joining the light-emitting element housing member A6 and a predetermined center point 303, the standard deviation of a relative angle θ of an optical axis 302a of the emitted light 302 was obtained.

Meanwhile, the printed-wiring assembly 300 that was used in evaluation had the size of (10 mm in width)×(10 mm in length)×(3 mm in height); the installation face for installing the light-emitting element housing member A6 had the flatness of 5 µm or less; and the perpendicularity of the corners was 90±0.3° or less. The evaluation result of the positioning accuracy in each structure is given below in Table 1.

TABLE 1

| Test piece number | Positioning mark | | Standard deviation | | | |
|---|---|---|---|---|---|---|
| | Planar arrangement | Shape | θ (°) | X (µm) | Y (µm) | Z (µm) |
| * 1 | No mark | | 3.2 | 20 | 5 | 10 |
| 2 | FIG. 13A | Cylindrical | 2.1 | 10 | 5 | 10 |
| 3 | FIG. 13B | Cylindrical | 2.2 | 5 | 5 | 6 |
| 4 | Same as above | Cylindrical (Recess) | 2.1 | 8 | 7 | 6 |
| 5 | Same as above | Conical | 2.3 | 7 | 6 | 7 |
| 6 | FIG. 13C | Prismatic | 1.1 | 4 | 5 | 8 |
| 7 | FIG. 13D | Cylindrical | 2.0 | 5 | 6 | 7 |
| 8 | FIG. 13E | Cylindrical | 1.5 | 4 | 6 | 8 |
| 9 | FIG. 13F | Cylindrical | 1.5 | 3 | 5 | 4 |
| 10 | FIG. 13G | Cylindrical | 0.9 | 2 | 6 | 3 |
| 11 | Same as above | Plane circular | 1.3 | 5 | 6 | 6 |
| 12 | FIG. 13H | Cylindrical | 0.6 | 2 | 5 | 2 |

* sign indicates being outside the scope of the present disclosure

As a result of comparing a test piece 1, where the positioning mark 121 was not provided, with test pieces 2 to 12, where the positioning marks 121 were provided as illustrated in FIGS. 13A to 13H; it can be understood that the light-emitting element housing member A6 according to the sixth embodiment is superior as far as the positioning accuracy of the light-emitting element 130 is concerned.

Moreover, as a result of comparing the test piece 2, where a single positioning mark 121 is provided, with the test pieces 3 to 12, where two or more positioning marks 121 are provided; it can be understood that there is further enhancement in the positioning accuracy of the light-emitting element 130 when two or more positioning marks 121 are provided.

Furthermore, as a result of comparing the test piece 11, where the positioning marks 121 having a planar shape are provided, with the test piece 10, where the positioning marks 121 having a stereoscopic shape are provided; it can be understood that there is further enhancement in the positioning accuracy of the light-emitting element 130 when the positioning marks 121 having a stereoscopic shape are provided.

At the end of the manufacturing process, with respect to the light-emitting element housing member A6 where the positioning accuracy of the light-emitting element 130 was evaluated, a Kovar lid was joined to the seal ring according to the seam welding method and the top-face opening 112 was covered, and the light-emitting device was manufactured.

In the light-emitting device manufactured in this way, the light-emitting element housing member A6 had the area of 10.5 mm$^2$ and the volume of 13.97 mm$^3$ in planar view. Those values were substantially smaller than the conventional TO-CAN package (in planar view, the area of 63.6 mm$^2$ and the volume of 635 mm$^3$) where the light-emitting element 130 having the same specifications was installed. That is, it was possible to substantially downsize the light-emitting device according to the sixth embodiment as compared to the conventional package.

Figure 23:
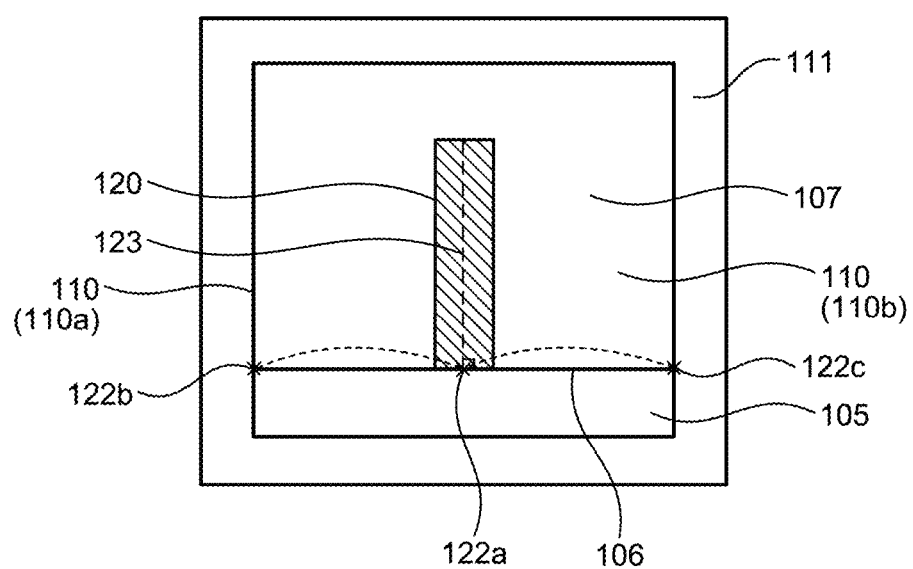
FIG. 23 is a plan view illustrating a positioning method for a light-emitting element in a conventional light-emitting element housing member.

Explained below with reference to FIG. 23 is the positioning method that was implemented for positioning the light-emitting element 130 in the test piece 1 where the positioning mark 121 is not provided. Firstly, using a CCD camera, the position of the LD mounting end face 106 was read along with the positions of cavity wall faces 110a and 110b that, from among the cavity wall faces 110, contacts the LD mounting end face 106.

The point of intersection between the LD mounting end face 106 and the cavity wall face 110a was treated as the auxiliary point 122b; the point of intersection between the LD mounting end face 106 and the cavity wall face 110b was treated as an auxiliary point 122c; and the midpoint of the auxiliary points 122b and 122c was treated as the origin 122a. Then, in an identical manner to the working example illustrated in FIG. 13A, the positioning axis 123 was identified from the positions of the origin 122a and the LD mounting end face 106, and the light-emitting element 130 (see FIG. 12) was installed in the mounting part 120 in alignment with the positions of the positioning axis 123 and the LD mounting end face 106.

<Working Example of Seventh Embodiment>

The following explanation is given about concretely manufacturing the light-emitting element housing member A7 according to the seventh embodiment; and then manufacturing a light-emitting device where the light-emitting element housing member A7 was adapted.

Firstly, as the mixed powder for forming the green sheets, a mixed powder is prepared by mixing 94 mass percent of aluminum nitride powder with 5 mass percent of yttria powder and 1 mass percent of calcia powder.

Then, with respect to 100 parts of the mixed powder (solid content), 20 parts of an acrylic binder representing an organic binder and 50 parts of toluene were added to prepare a slurry; and then the doctor blade method was implemented to prepare green sheets having the average thickness of 500 μm.

Moreover, during the formation of conductors such as conductor patterns and via conductors, a conductive paste was used where 20 parts by mass of aluminum nitride powder, 8 parts by mass of an acrylic binder, and terpineol were appropriately added to 100 parts by mass of tungsten powder. Furthermore, apart from that concerned conductive paste, another conductive paste formed by adding 0.5 mass percent of a thixotropic agent to the concerned conductive paste was also used, and another conductive paste formed by adding 1.0 mass percent of a thixotropic agent to the concerned conductive paste was also used.

Then, using the green sheets and the conductors having the composition as described above, the laminated compact 190 (see FIG. 20(d)) was manufactured according to the manufacturing method illustrated in FIGS. 14 to 16 and FIG. 20.

Subsequently, in a reducing atmosphere, the laminated compact 190 was burnt for two hours with the maximum temperature of 1800° C., and the light-emitting element housing member A7 was manufactured. Regarding the size of the manufactured light-emitting element housing member A7, the post-burning shape was (2.5 mm in width)×(4.2 mm in length)×(1.08 mm in thickness).

Subsequently, on the conductor pattern 141 (see FIG. 20(d)) that is formed on the wall top face 211 of the light-emitting element housing member A7 (see FIG. 18A), an Ni plated film having a thickness of approximately 5 μm was formed. Then, to the Ni plated film, a Kovar seal ring (having thickness of 0.1 mm) was joined using Ag—Cu wax at 800° C.

Subsequently, using a low-melting-point glass paste, a glass plate ((1.7 mm in width)×(0.8 mm in height)) was glued at 430° C. around the opening 204 ((1.4 mm in width)×(0.43 mm in height)) formed in the light-emitting element housing member A7 (see FIG. 18A), and the opening 204 was covered. Herein, a glass plate having an antireflection coating layer was used.

Subsequently, the light-emitting element 230 was installed in the mounting face 207 of the light-emitting element housing member A7. Herein, as the light-emitting element 230, a semiconductor laser element having the oscillation wavelength of 462 nm ((0.3 mm in width)×(1.2 mm in length)×(0.15 mm in height)) was used. Moreover, Au—Sn solder was used for joining the light-emitting element 230 to the mounting face 207.

Then, various characteristics of the light-emitting element housing member A7 were evaluated. At the same time, the evaluation was performed also with respect to a test piece where the conventional light-emitting element housing member not having the chamfered portion 220 formed therein, and with respect to a test piece formed using a conductive paste having a thixotropic agent added thereto.

The evaluated characteristics included the luminous efficiency, the heat dissipation capacity, the optical axis accuracy, and reliability; and the number of test pieces was set to n=20 with respect to each structure.

Regarding the luminous efficiency representing the first item of characteristic evaluation, the luminance of the light emitted from the light-emitting element housing member A7 was evaluated using a luminance meter in a darkroom. Moreover, the value of the evaluation result was treated as the relative value in the case where the luminance of 1.0 was set as the luminance measured in a test piece configured with the conventional light-emitting element housing member not having the chamfered portion 220 formed therein.

Regarding the heat dissipation capacity representing the second item of characteristic evaluation, the amount of heat produced at the time when the light-emitting element 230 attains the temperature of 80° C. was obtained using simulation analysis. At that time, a model was used where a heat dissipating member was joined to the light-emitting element housing member A7. The heat dissipation member that was joined had the size ((2 mm in width)×(3 mm in length)×(2 mm in thickness)) sufficient for attachment over the entire reverse side of the light-emitting element housing member A7.

Regarding the optical axis accuracy representing the third item of characteristic evaluation, the evaluation was performed using the evaluation device illustrated in FIG. 22. The details of the evaluation method are identical to the explanation given earlier in the sixth embodiment. Hence, the details are not explained again.

Regarding the reliability representing the fourth item of characteristic evaluation, 100 cycles of a thermal cycle test were performed in the temperature range of −65° C. to 150° C. Moreover, fluorescent penetrant examination was performed to evaluate the presence or absence of cracks in the test piece after being subjected to the thermal cycle test, and the number of generated cracks was counted in the 20 test pieces. Meanwhile, the result of each item of characteristic evaluation is given below in Table 2.

Moreover, in the test piece 17, a still greater amount of a thixotropic agent is added so that the thickness of the metallization layer becomes smaller on the side of the edge portion (i.e., on the side of the chamfered portion 220) (see Table 2). That is, the test piece 17 has the structure that alleviates the difference in the coefficients of thermal expansion of the ceramic mounting part 202 and the metallic conductive layer 208 as illustrated in FIG. 19D, thereby resulting in enhancement of reliability.

At the end of the manufacturing process, with respect to the light-emitting element housing member A7 where a

TABLE 2

| Test piece number | Shape of chamfered portion | Composition of conductive paste | Thickness of metallization layer | | Luminous efficiency (a.u.) | Heat dissipation Amount of heat produced | | Reliability test |
|---|---|---|---|---|---|---|---|---|
| | | | Central portion (μm) | Edge portion (μm) | | (W) when LD is at 80° C. | Standard deviation θ (°) | Number of defective pieces |
| * 13 | No chamfered portion | No thixotropic agent | 34 | 44 | 1.0 | 5.1 | 3.2 | 7/20 |
| 14 | Planar shape | No thixotropic agent | 38 | 43 | 1.25 | 3.8 | 3.7 | 6/20 |
| 15 | Curved shape | No thixotropic agent | 34 | 45 | 1.27 | 5.2 | 0.8 | 6/20 |
| 16 | Curved shape | Thixotropic agent 0.5% | 36 | 37 | 1.29 | 5.2 | 0.7 | 2/20 |
| 17 | Curved shape | Thixotropic agent 1.0% | 38 | 21 | 1.27 | 5.1 | 0.9 | 0/20 |

* sign indicates being outside the scope of the present disclosure

As a result of comparing the test piece 13, where the chamfered portion 220 was not formed, with the test pieces 14 and 15, where the chamfered portion 220 was formed; it can be understood that there is enhancement in the luminous efficiency of the light-emitting element housing member A7 according to the seventh embodiment.

Moreover, as a result of comparing the test piece 14, where the chamfered portion 220 had a planar shape, with the test piece 15, where the chamfered portion 220 had a curved shape; it can be understood that there is enhancement in the heat dissipation capacity as a result of forming the chamfered portion 220 in a curved shape.

Furthermore, as a result of comparing the test piece 14, where the chamfered portion 220 had a planar shape, with the test piece 15, where the chamfered portion 220 has a curved shape; it can be understood that there is enhancement in the optical axis accuracy as a result of forming the chamfered portion 220 in a curved shape.

Moreover, as a result of comparing the test piece 15, where a thixotropic agent is not added to the conductive paste, with the test piece 16, where a thixotropic agent is added to the conductive paste; it can be understood that there is enhancement in the reliability as a result of adding a thixotropic agent to the conductive paste.

As a result of adding a thixotropic agent to the conductive paste, there is enhancement in the levelling performance of the conductive paste. Hence, the test piece 16 is configured in such a way that the metallization layer has a substantially even thickness in the middle portion and the edge portion (see Table 2). That is, the test piece 16 has the structure enabling formation of meniscus between the light-emitting element 230 and the conductive layer 208 as illustrated in FIG. 19C, thereby resulting in enhancement in the reliability.

variety of characteristic evaluation was performed, a Kovar lid was joined to the seal ring according to the seam welding method and the top-face opening 212 was covered, and the light-emitting device was manufactured.

In the light-emitting device manufactured in this way, the light-emitting element housing member A7 had the area of 10.5 mm$^2$ and the volume of 13.97 mm$^3$ in planar view. Those values were substantially smaller than the conventional TO-CAN package (in planar view, the area of 63.6 mm$^2$ and the volume of 635 mm$^3$) where the light-emitting element 230 having the same specifications was installed. That is, it was possible to substantially downsize the light-emitting device according to the seventh embodiment as compared to the conventional package.

Meanwhile, although the explanation above is given about the embodiments of the present disclosure, the present disclosure is not to be thus limited to the embodiments but is to be construed as embodying all modifications and alternative constructions that fairly fall within the basic teaching herein set forth. For example, in the embodiments described above, although a semiconductor laser is used as the light-emitting element, the light emitting-element is not limited to a semiconductor laser.

As described above, the light-emitting element housing member A1 (A1a to A1d) according to the embodiments is made of a ceramic; and includes the substrate 1 where the deep-bottom-type space portion 7 has the opening 5 formed in at least one portion thereof and the inner wall of the space portion 7 (the inner wall face 7b) serves as the mounting part 11 for the light-emitting element 9. As a result, it becomes possible to achieve an enhanced heat dissipation capacity and downsizing.

Moreover, in the light-emitting element housing member A1 (A1a, A1c, and A1d) according to the embodiments, the substrate 1 is made of the two end faces 3a and 3b facing each other and the side face 4 that is perpendicular to the end faces 3a and 3b. As a result, it becomes possible to achieve an enhanced heat dissipation capacity and downsizing.

Furthermore, in the light-emitting element housing member A1 according to the embodiments, when viewed from the direction perpendicular to the end faces 3a and 3b, the mounting part 11 is disposed in the central portion C of the end faces 3a and 3b. As a result, the emission of light can be performed in a stable manner.

Moreover, in the light-emitting element housing member A1b according to the embodiments, the substrate 1 has a truncated-conical shape. As a result, the axial runout of the optical axis can be reduced during the driving too.

Furthermore, in the light-emitting element housing member A1c according to the embodiments, in the substrate 1, at least a part of the inner wall (the inner wall face 7b) constitutes an inclined face, and an area of the frontage on the side of the opening 5 is greater than an area of the base portion 7a positioned at a back thereof. As a result, it becomes possible to obtain the light-emitting device capable of covering a wide range even if the number of light-emitting elements 9 is small.

Moreover, in the light-emitting element housing member A1d, in the substrate 1, the frontage is greater in size than the back side due to the level difference 5a near the opening 5. As a result, it becomes possible to enhance the reliability of the light-emitting device.

The light-emitting element housing member A2 (A3 to A14) according to the embodiments includes the substrate 21 that includes: the bottom base material 22 (102, 201a) that has a rectangular shape in planar view; the wall member 23 (103, 201b) that encloses, in a U-shaped manner, the mounting part 26 (120, 202) for mounting the light-emitting element 9 (130, 230) and that has the opening 27 (104, 204) formed in at least one position: and the mounting part 26 (120, 202) that is disposed in the area on the inside of the wall member 23 (103, 201b. Besides, the substrate 21 is integrally formed using a ceramic. As a result, it becomes possible to achieve an enhanced heat dissipation capacity and downsizing.

Moreover, in the light-emitting element housing member A3 according to the embodiments, when viewed from the side of the opening 27, the mounting part 26 is disposed at the position of the center in the height direction of the wall member 23. As a result, the emission of light can be performed in a stable manner.

Furthermore, in the light-emitting element housing member A4 (A5) according to the embodiments, the bridge member 29 is disposed in the opening 27 in between the wall members 23. As a result, the heat dissipation capacity of the entire substrate 21 can be enhanced.

Moreover, in the light-emitting element housing member A5 according to the embodiments, the bridge member 29 is curved. That enables achieving enhancement in the heat dissipation capacity of the bridge member 29.

Furthermore, in the light-emitting element housing member A3 (A4, A5) according to the embodiments, the thickness of the wall members 23 becomes smaller from the bottom base material 22 toward the top face. As a result, during the brazing process, even if load gets applied on the wall members 23, it becomes possible to prevent the wall members 23 from breaking.

Moreover, in the light-emitting element housing member A1 (A2 to A5) according to the embodiments, the mounting part 11 (26) is configured with the first mounting part 25a for a laser diode, and the second mounting part 25b for a photodiode that is adjacent to the first mounting part 25a. As a result, it becomes possible to obtain the light-emitting device having a high degree of general versatility.

Furthermore, in the light-emitting element housing member A6 according to the embodiments, the positioning mark 121 is provided around the mounting part 120 for determining the mounting position of the light-emitting element 130. As a result, even if the light-emitting element such as a semiconductor laser having an elongated shape is to be mounted in the substrate 1, the optical axis of the light emitted from the light-emitting face 130a can be aligned with ease.

Moreover, in the light-emitting element housing member A6 according to the embodiments, the positioning mark 121 has a concave shape or a convex shape that is formed integrally with the substrate 101. As a result, the position of the light-emitting element 130 can be determined with a higher degree of accuracy, as well as the manufacturing cost of the substrate 101 can be prevented from rising.

Furthermore, in the light-emitting element housing member A6 according to the embodiments, the positioning mark 121 has at least one shape among the cylindrical shape, the conical shape, the prismatic shape, and the pyramidal shape. As a result, the position of the positioning mark 121 can be made to be easily recognizable.

Moreover, in the light-emitting element housing member A7 (A8 to A14) according to the embodiments, the mounting part 202 includes the chamfered portion 220 at the edge facing the opening 204. That enables achieving enhancement in the luminous efficiency of the light emitted to the outside.

Furthermore, the array member C1 according to the embodiments is formed by joining a plurality of light-emitting element housing members A1 (A2 to A5). As a result, it becomes possible to obtain an array-type light-emitting device.

Moreover, the array member C1 according to the embodiments is formed by integrally sintering the light-emitting element housing members A1 (A2 to A5). As a result, it becomes possible to obtain an array-type light-emitting device having an enhanced heat dissipation capacity and a high degree of strength.

Furthermore, in the light-emitting device according to the embodiments, the light-emitting element 9 (130, 230) is disposed in the mounting part 11 (26, 120, 202) of the light-emitting element housing member A1 (A1a to A1d, A2 to A14). As a result, it becomes possible to obtain the light-emitting element having an enhanced heat dissipation capacity and a compact size.

Moreover, the light-emitting device according to the embodiments includes the array member C1 and the light-emitting element 9 that is mounted in the mounting part 11 (26) of the array member C1. As a result, it becomes possible to obtain an array-type light-emitting device having an enhanced heat dissipation capacity and a high degree of strength.

Meanwhile, additional advantages and variations may be readily derived by those skilled in the art. Therefore, broader aspects of the present disclosure are not to be limited to the specific details and representative embodiments illustrated and described herein. Hence, without departing from the spirit or scope of the general inventive concept as defined by the scope and equivalents of the appended claims, various modifications are possible.

REFERENCE SIGNS LIST

A1, A1a to A1d, A2 to A14 light-emitting element housing member
1, 21, 101, 201 substrate
3a, 3b end face
4 side face
5, 27, 104, 204 opening
7, 24 space portion
7b inner wall face
9, 130, 230 light-emitting element
9a, 130a, 230a light-emitting face
11, 26, 120, 202 mounting part
22, 102, 201a bottom base material
23, 103, 201b wall member
28 lid
29 bridge member
50 semiconductor laser device
51 semiconductor laser
53 stem base
55 stem block
57 insulation member
61 glass plate
63 lead pin
C1 array member
121, 121a to 121d positioning mark
220 chamfered portion

The invention claimed is:

1. A light-emitting element housing member, comprising:
a ceramic substrate that includes a bottom base material having a rectangular shape in a planar view, wall members provided on the bottom base material to enclose a mounting part for mounting a light-emitting element; and
an opening in at least one portion of the wall members, wherein
the wall members encloses a mounting face of the mounting part in a U-shaped manner in a planar view, and
the ceramic substrate comprises a bridge member in a top portion of the opening between opposing two side wall members without involving any bonded surface therebetween.

2. The light-emitting element housing member according to claim 1, wherein, when viewed from a side of the opening, the mounting part is centered in a height direction of the wall members.

3. The light-emitting element housing member according to claim 1, wherein the bridge member is curved.

4. The light-emitting element housing member according to claim 1, wherein a thickness of the wall members decreases from the bottom base material to a top face of the ceramic substrate.

5. The light-emitting element housing member according to claim 1, wherein the mounting part comprises a first mounting part for a laser diode, and a second mounting part for a photodiode that is adjacent to the first mounting part.

6. The light-emitting element housing member according to claim 1, comprising a positioning mark on the mounting part that determines a mounting position of the light-emitting element.

7. The light-emitting element housing member according to claim 6, wherein the positioning mark has a concave shape or a convex shape that is formed integrally with the substrate.

8. The light-emitting element housing member according to claim 6, wherein a shape of the positioning mark is at least one of a cylindrical shape, a conical shape, a prismatic shape, and a pyramidal shape.

9. The light-emitting element housing member according to claim 1, wherein the mounting part has a chamfered portion at an edge that faces the opening.

10. An array member, wherein a plurality of the light-emitting element housing members according to claim 1 are joined.

11. The array member according to claim 10, wherein the light-emitting element housing members are sintered integrally with one another.

12. A light-emitting device, comprising:
the array member according to claim 10; and
a light-emitting element that is mounted on the mounting part of the array member.

13. A light-emitting device, comprising a light-emitting element mounted on the mounting part of the light-emitting element housing member according to claim 1.

* * * * *